United States Patent
Zhang et al.

(10) Patent No.: US 11,025,278 B2
(45) Date of Patent: Jun. 1, 2021

(54) POLAR CODING ENCODING/DECODING METHOD AND APPARATUS

(71) Applicant: HUAWEI TECHNOLOGIES CO., LTD., Guangdong (CN)

(72) Inventors: Gongzheng Zhang, Hangzhou (CN); Huazi Zhang, Hangzhou (CN); Yunfei Qiao, Hangzhou (CN); Rong Li, Hangzhou (CN); Jun Wang, Hangzhou (CN); Guijie Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/519,988

(22) Filed: Jul. 23, 2019

(65) Prior Publication Data

US 2019/0349009 A1    Nov. 14, 2019

Related U.S. Application Data

(63) Continuation of application No. PCT/CN2018/073908, filed on Jan. 24, 2018.

(30) Foreign Application Priority Data

Jan. 26, 2017  (CN) .......................... 201710061829.6

(51) Int. Cl.
    *H03M 13/13*    (2006.01)
    *H03M 13/09*    (2006.01)
    (Continued)

(52) U.S. Cl.
    CPC .......... *H03M 13/13* (2013.01); *H03M 13/09* (2013.01); *H03M 13/616* (2013.01); *H04L 1/0061* (2013.01); *H04L 69/324* (2013.01)

(58) Field of Classification Search
    CPC .... H03M 13/13; H03M 13/09; H03M 13/616; H04L 1/0061; H04L 69/324
    (Continued)

(56) References Cited

U.S. PATENT DOCUMENTS

2016/0294418 A1    10/2016  Huang et al.
2018/0076922 A1*   3/2018   Zhang ................. H03M 13/616
(Continued)

FOREIGN PATENT DOCUMENTS

| CN | 105553892 A | 5/2016 |
|----|-------------|--------|
| CN | 105811998 A | 7/2016 |
| CN | 106027071 A | 10/2016 |

OTHER PUBLICATIONS

Intel Corp.:"Polar code design", 3GPP draft R1-1700386, RAN WG1, XP051207923, Spokane, USA, Jan. 16-20, 2017, 12 pages.
(Continued)

*Primary Examiner* — John J Tabone, Jr.
(74) *Attorney, Agent, or Firm* — Fish & Richardson P.C.

(57) ABSTRACT

The present disclosure relates to polar encoding methods and apparatus. One example method includes obtaining locations of information bits and frozen bits based on a reliability order of polar channels, where reliability of a polar channel corresponding to the information bits is higher than reliability of a polar channel corresponding to the frozen bits, performing cyclic redundancy check (CRC) encoding on an information block, mapping bits obtained after the CRC encoding to the information bits, determining at least one bit of the frozen bits as a check frozen bit, where a value of the check frozen bit is determined based on values of P information bits that are in information bits prior to the check frozen bit and that meet a preset condition, and performing polar encoding on the information bits, the check frozen bit, and a frozen bit other than the check frozen bit.

20 Claims, 14 Drawing Sheets

(51) Int. Cl.
*H03M 13/00* (2006.01)
*H04L 1/00* (2006.01)
*H04L 29/08* (2006.01)

(58) Field of Classification Search
USPC ............... 714/776, 780, 786, 799, 800, 821
See application file for complete search history.

(56) References Cited

U.S. PATENT DOCUMENTS

2019/0260391 A1* 8/2019 Hui .................. H04L 1/0045
2019/0349002 A1* 11/2019 Zhou ................ H03M 13/09

OTHER PUBLICATIONS

Huawei, "Summary of polar code design for control channels", 3GPP draft R1-1700088, RAN WG1, XP051207630, Spokane, USA, Jan. 16-20, 20177, 10 pages.
Wang et al., "Parity-Check-Concatenated Polar Codes", IEEE Communications Letters, vol. 20, No. 12, XP055607890, Sep. 8, 2016, 13 pages.
Extended European Search Report issued in European Application No. 18745275.0 dated Dec. 2, 2019, 10 pages.
PCT International Search Report and Written Opinion in International Application No. PCT/CN2018/073,908, dated Apr. 9, 2018, 16 pages (With English Translation).

* cited by examiner

1100

$$G_{32} = \begin{matrix} \text{(matrix of 0s and 1s)} \end{matrix}$$

POLAR CODING ENCODING/DECODING METHOD AND APPARATUS

CROSS-REFERENCE TO RELATED APPLICATIONS

This application is a continuation of International Application No. PCT/CN2018/073908, filed on Jan. 24, 2018, which claims priority to Chinese Patent Application No. 201710061829.6, filed on Jan. 26, 2017. The disclosures of the aforementioned applications are hereby incorporated by reference in their entireties.

TECHNICAL FIELD

Embodiments of the present invention relate to the wireless communications field, and more specifically, to a polar code encoding/decoding method and apparatus.

BACKGROUND

In a communications system, channel encoding is usually performed to improve data transmission reliability and ensure communication quality. A polar code (Polar code) proposed by the Turkish professor Arikan is first theoretically proved to be a high-performance code that can achieve a Shannon capacity and that has low encoding/decoding complexity. The polar code is a linear block code. An encoding matrix of the polar code is $G_N$, and an encoding process is $x_1^N = u_1^N G_N$, where $u_1^N = (u_1, u_2, \ldots, u_N)$ is a binary row vector whose length is N (namely, a mother code length), $G_N$ is an N×N matrix, and $G_N = F_2^{\otimes (\log_2(N))}$. $F_2^{\otimes (\log_2(N))}$ is defined as a Kronecker (Kronecker) product of $\log_2 N$ matrices $F_2$.

The matrix $$F_2 = \begin{bmatrix} 1 & 0 \\ 1 & 1 \end{bmatrix}.$$

In a conventional encoding process of the polar code, some bits in $u_1^N$ are used to carry information, and are referred to as information bits. A set of indexes of the bits is denoted as A. The other bits are set to a fixed value agreed on by a transmit end and a receive end in advance, and are referred to as fixed bits or frozen bits (frozen bits). A set of indexes of the bits is denoted as $A^c$ that is a complementary set of A. The encoding process of the polar code is equivalent to $x_1^N = u_A G_N(A) \oplus u_{A^c} G_N(A^c)$. Herein, $G_N(A)$ is a submatrix obtained by using rows corresponding to the indexes in the set A in $G_N$; $G_N(A^c)$ is a submatrix obtained by using rows corresponding to the indexes in the set $A^c$ in $G_N$; $u_A$ is an information bit set in $u_1^N$, and a quantity of information bits is K; and $u_{A^c}$ is a frozen bit set in $u_1^N$, a quantity of frozen bits is (N−K), and the frozen bits are known bits. Values of the frozen bits are usually set to 0. However, the fixed bits may be randomly set provided that the transmit end and the receive end agree in advance. When the fixed bits are set to 0, an encoding output of the polar code may be simplified as $x_1^N = u_A G_N(A)$ that is a K×N matrix.

A construction process of the polar code is a selection process of the set A, and determines performance of the polar code. The construction process of the polar code usually includes: determining, based on the mother code length N, that there are N polar channels in total that are respectively corresponding to N rows in the encoding matrix; calculating reliability of the polar channels; and using indexes of the first K polar channels with relatively high reliability as elements in the set A, and using indexes corresponding to the remaining (N−K) polar channels as elements in the set $A^c$ of the indexes of the fixed bits. A location of the information bit depends on the set A, and a location of the fixed bit depends on the set $A^c$.

On a decoding side, the polar code may be sequentially decoded, starting from the first bit, by using a successive cancellation (SC) decoding algorithm. A successive cancellation list (SCL) decoding algorithm is an improvement to the SC decoding algorithm, and a plurality of candidate decoding results are retained in a decoding process. In the SCL, the decoding process is considered as a path search process. To be specific, a path is extended by using the first bit as a root node, and the path is evaluated by using a metric. The metric is dynamically updated according to a predetermined rule as path extension is performed. In each time of extension (when a next bit is decoded), L candidate paths with optimal path metrics at a current layer are retained until extension is performed at the last layer (the last bit is decoded). Finally, a path with the most optimal metric in the L candidate paths is output as a decoding output. The SCL decoding algorithm can achieve maximum likelihood decoding performance.

To improve performance of the polar code, the polar code is improved in the prior art, and a CA-polar code is proposed. The CA-polar code is a polar code that is concatenated with CRC (Cyclic Redundancy Check). CRC encoding is performed on an information block, and then encoded bits are mapped to information bits. Correspondingly, decoding is performed by using a CA-SCL (CRC-Aided Successive Cancellation List) decoding algorithm. To be specific, a candidate path on which CRC succeeds is selected, as a decoding output, from the L candidate paths that are output during SCL decoding. During CA-SCL decoding, if a correct path is deleted due to a relatively poor metric at an intermediate node, SCL decoding performance cannot be improved during subsequent CRC check.

SUMMARY

Embodiments of this application provide a polar code encoding/decoding method and apparatus, to further improve performance of a CA-polar code.

According to a first aspect, a polar encoding method is provided. The method includes:

obtaining locations of information bits and frozen bits based on a reliability order of polar channels, where reliability of a polar channel corresponding to the information bit is higher than reliability of a polar channel corresponding to the frozen bit;

performing cyclic redundancy check CRC encoding on an information block, and mapping bits obtained after the CRC encoding to the information bits;

determining at least one of the frozen bits as a check frozen bit, where a value of the check frozen bit is determined based on values of P information bits that are in information bits prior to the check frozen bit and that meet a preset condition, and P is an integer greater than or equal to 1; and performing polar encoding on the information bits, the check frozen bit, and a frozen bit other than the check frozen bit.

According to a second aspect, an encoding apparatus is provided. The apparatus includes:

an obtaining unit, configured to obtain locations of information bits and frozen bits based on a reliability order of polar channels, where reliability of a polar channel corresponding to the information bit is higher than reliability of a polar channel corresponding to the frozen bit;

a CRC encoding unit, configured to: perform cyclic redundancy check CRC encoding on an information block, and map bits obtained after the CRC encoding to the information bits;

a determining unit, configured to determine at least one of the frozen bits as a check frozen bit, where a value of the check frozen bit is determined based on values of P information bits that are in information bits prior to the check frozen bit and that meet a preset condition, and P is an integer greater than or equal to 1; and a polar encoding unit, configured to perform polar encoding on the information bits, the check frozen bit, and a frozen bit other than the check frozen bit.

According to a third aspect, an encoding apparatus is provided. The apparatus includes:

a memory, configured to store a program; and a processor, configured to execute the program stored in the memory, where when executing the program, the processor is configured to: obtain locations of information bits and frozen bits based on a reliability order of polar channels, where reliability of a polar channel corresponding to the information bit is higher than reliability of a polar channel corresponding to the frozen bit; perform cyclic redundancy check CRC encoding on an information block, and map bits obtained after the CRC encoding to the information bits; determine at least one of the frozen bits as a check frozen bit, where a value of the check frozen bit is determined based on values of P information bits that are in information bits prior to the check frozen bit and that meet a preset condition, and P is an integer greater than or equal to 1; and perform polar encoding on the information bits, the check frozen bit, and a frozen bit other than the check frozen bit.

According to a fourth aspect, an encoding apparatus is provided. The apparatus includes:

at least one input end, configured to receive an information block;

a signal processor, configured to: obtain locations of information bits and frozen bits based on a reliability order of polar channels, where reliability of a polar channel corresponding to the information bit is higher than reliability of a polar channel corresponding to the frozen bit; perform cyclic redundancy check CRC encoding on the information block, and map bits obtained after the CRC encoding to the information bits; determine at least one of the frozen bits as a check frozen bit, where a value of the check frozen bit is determined based on values of P information bits that are in information bits prior to the check frozen bit and that meet a preset condition, and P is an integer greater than or equal to 1; and perform polar encoding on the information bits, the check frozen bit, and a frozen bit other than the check frozen bit; and at least one output end, configured to output an encoded block obtained by the signal processor.

According to a fifth aspect, a polar decoding method is provided. The method includes:

obtaining locations of information bits and frozen bits in to-be-decoded bits, and determining at least one of the frozen bits as a check frozen bit;

sequentially decoding the to-be-decoded bits by using a successive cancellation list SCL decoding algorithm, to output L candidate paths with optimal metrics, where a decoding result on each candidate path includes an information block and cyclic redundancy check CRC bits, a value of the check frozen bit on each path is determined based on values of P decoded information bits that are in information bits prior to the check frozen bit and that meet a preset condition, and P is an integer greater than or equal to 1; and performing CRC check on the L candidate paths starting from a candidate path with the most optimal metric, and using, as a decoding output, an information block on the first candidate path on which the CRC check succeeds.

According to a sixth aspect, a decoding apparatus is provided. The apparatus includes:

an obtaining unit, configured to: obtain locations of information bits and frozen bits in to-be-decoded bits, and determine at least one of the frozen bits as a check frozen bit;

a decoding unit, configured to sequentially decode the to-be-decoded bits by using a successive cancellation list SCL decoding algorithm, to output L candidate paths with optimal metrics, where a decoding result on each candidate path includes an information block and cyclic redundancy check CRC bits, a value of the check frozen bit on each path is determined based on values of P decoded information bits that are in information bits prior to the check frozen bit and that meet a preset condition, and P is an integer greater than or equal to 1;

a CRC check unit, configured to perform CRC check on the L candidate paths starting from a candidate path with the most optimal metric; and an output unit, configured to use, as a decoding output, an information block on the first candidate path on which the CRC check succeeds.

According to a seventh aspect, a decoding apparatus is provided. The apparatus includes:

a memory, configured to store a program; and a processor, configured to execute the program stored in the memory, where when executing the program, the processor is configured to: obtain locations of information bits and frozen bits in to-be-decoded bits, and determine at least one of the frozen bits as a check frozen bit; sequentially decode the to-be-decoded bits by using a successive cancellation list SCL decoding algorithm, to output L candidate paths with optimal metrics, where a decoding result on each candidate path includes an information block and cyclic redundancy check CRC bits, a value of the check frozen bit on each path is determined based on values of P decoded information bits that are in information bits prior to the check frozen bit and that meet a preset condition, and P is an integer greater than or equal to 1; and perform CRC check on the L candidate paths starting from a candidate path with the most optimal metric, and use, as a decoding output, an information block on the first candidate path on which the CRC check succeeds.

According to an eighth aspect, a decoding apparatus is provided. The apparatus includes:

at least one input end, configured to receive information about to-be-decoded bits;

a signal processor, configured to: obtain locations of information bits and frozen bits in the to-be-decoded bits, and determine at least one of the frozen bits as a check frozen bit; sequentially decode the to-be-decoded bits by using a successive cancellation list SCL decoding algorithm, to output L candidate paths with optimal metrics, where a decoding result on each candidate path includes an information block and cyclic redundancy check CRC bits, a value of the check frozen bit on each path is determined based on values of P decoded information bits that are in information bits prior to the check frozen bit and that meet a preset condition, and P is an integer greater than or equal to 1; and perform CRC check on the L candidate paths starting from a candidate path with the most optimal metric; and at least one output end, configured to use, as a decoding output, an information block on the first candidate path on which the CRC check succeeds.

With reference to all the foregoing aspects, in a first possible implementation, sequence numbers of the P information bits are the same as a value obtained after a sequence number of the check frozen bit mod Q, and Q is an integer greater than or equal to 1.

With reference to the first possible implementation, in a second possible implementation, Q is a prime number or an odd number.

With reference to the first or second possible implementation, in a third possible implementation, Q is 3, 5, 7, or 9.

With reference to the first possible implementation, in a fourth possible implementation, the P information bits that meet the preset condition are information bits that are randomly determined in all information bits prior to the check frozen bit.

With reference to the fourth possible implementation, in a fifth possible implementation, for each check frozen bit, a random number is generated for each information bit prior to the check frozen bit by using a random seed, and if the random number is less than a preset threshold T, the information bit participates in determining the value of the check frozen bit.

With reference to the fifth possible implementation, in a sixth possible implementation, random numbers evenly distributed between 0 and 1 are generated by using the random seed, and T is a value greater than 0 and less than 1.

With reference to the sixth possible implementation, in a seventh possible implementation, the threshold T is a value approximately equal to or equal to ⅓ or ⅕.

With reference to all the foregoing aspects, in an eighth possible implementation, the P information bits are information bits corresponding to sequence numbers that are the same as a value obtained after a sequence number of the check frozen bit mod Q or M, and Q and M are prime numbers or odd numbers different from each other; or sequence numbers of the P information bits are odd numbers or prime numbers; or the P information bits include an information bit whose sequence number is the same as a value obtained after a sequence number of the check frozen bit mod Q1, Q2, . . . , or Qh, h is an integer greater than or equal to 2, and Q1, Q2, . . . , and Qh are respectively integers greater than or equal to 1 and different from each other. When information bits that participate in determining the value of the check frozen bit are determined by performing a modulo operation, one number such as 5 may be used to perform a modulo operation. Alternatively, two or more numbers may be simultaneously used. For example, information bits corresponding to all sequence numbers that are the same as a value obtained after the sequence number of the check frozen bit mod 3, 5, or 7 are all used to determine the value of the check frozen bit.

With reference to all the foregoing aspects, in a ninth possible implementation, P=1.

With reference to the ninth possible implementation, in a tenth possible implementation, the one information bit is closest to the check frozen bit, and a difference between a sequence number of the check frozen bit and a sequence number of the one information bit is not equal to an integer power of 2.

With reference to all the foregoing aspects or all the possible implementations, in an eleventh possible implementation, all the frozen bits are check frozen bits, and if there is no information bit that meets the preset condition and that is prior to a check frozen bit, the check frozen bit remains as a frozen bit, and is set to a fixed value.

With reference to all the foregoing aspects or all the possible implementations, in a twelfth possible implementation, a quantity of 1s in a vector obtained by adding a row vector that is corresponding to any one of the P information bits and that is in the encoding matrix and a row vector that is corresponding to the check frozen bit and that is in the encoding matrix is greater than a quantity of 1s in the row vector that is corresponding to the any one information bit and that is in the encoding matrix.

With reference to all the foregoing aspects or all the possible implementations, in a thirteenth possible implementation, the information bits and the frozen bits are sorted based on a natural order of the polar channels.

With reference to the first, second, third, or the eighth possible implementation, in a fourteenth possible implementation, the P information bits are selected by using a shift register.

With reference to the first, second, third, or fourth aspect or the possible implementations thereof, in a fifteenth possible implementation, the performing cyclic redundancy check CRC encoding on an information block includes any one of the following:

performing CRC encoding on the information block, to obtain bits obtained after the CRC encoding, where the bits obtained after the CRC encoding include the information block and $K_{CRC}$ CRC bits, and $K_{CRC}$ is a preset fixed CRC length; or dividing the information block into a plurality of segments, and performing CRC encoding on each segment of the information block, to obtain bits obtained after the CRC encoding, where the bits obtained after the CRC encoding include the information block and $K_{CRC}$ CRC bits, and $K_{CRC}$ is a preset fixed CRC length or a length obtained by adding a fixed CRC length and an additional CRC length; or performing overall CRC encoding on the information block, to obtain bits obtained after the CRC encoding, where the bits obtained after the CRC encoding include the information block and $(K_{CRC}+K'_{CRC})$ CRC bits, $K_{CRC}$ is a preset fixed CRC length, and $K'_{CRC}$ is an additional CRC length; or performing first-level CRC encoding on the information block, to obtain bits obtained after the CRC encoding, where the bits obtained after the first-level CRC encoding include the information block and $K_{CRC}$ CRC bits, and performing second-level CRC encoding by using the bits obtained after the first-level CRC encoding as an entire block, to obtain bits obtained after the second-level CRC encoding, where the bits obtained after the second-level CRC encoding include the information block, the $K_{CRC}$ first-level CRC bits, and $K'_{CRC}$ second-level CRC bits, $K_{CRC}$ is a preset fixed CRC length, and $K'_{CRC}$ is an additional CRC length, where $K_{CRC}$ and $K'_{CRC}$ are integers greater than 0.

With reference to the fifteenth possible implementation, in a sixteenth possible implementation, $K'_{CRC}$ is determined based on a quantity L of candidate paths existing during SCL decoding. For example, if $K'_{CRC}=\log_2(L)$, when L=8, $K'_{CRC}=3$.

With reference to the first, second, third, or the fourth aspect or the corresponding possible implementations, the fifteenth possible implementation, or the sixteenth possible implementation, in a seventeenth possible implementation, after the bits obtained after the CRC encoding are mapped to the information bits, a location relationship between the CRC bits and the information block includes any one of the following:
the CRC bits are located after the information block; or
the CRC bits are located before the information block; or
the CRC bits are inserted into the information block; or
the CRC bits are divided into a plurality of segments, and each segment is inserted into the information block, is located before the information block, or is located after the information block.

With reference to any one of the fifth aspect to the eighth aspect, in an eighteenth possible implementation, the metric is a path metric PM.

With reference to any one of the fifth aspect to the eighth aspect, in a nineteenth possible implementation, if the CRC check on all the L candidate paths fails, an information block on a path with the most optimal metric in the L candidate paths is used as a decoding output, or it is determined that decoding fails.

According to a ninth aspect of this application, a computer readable storage medium is provided. The computer readable storage medium stores an instruction, and when the instruction runs on a computer, the computer is enabled to perform the encoding method or the decoding method in the foregoing aspects or the possible implementations.

According to another aspect of this application, a computer program product including an instruction is provided. When the computer program product runs on a computer, the computer is enabled to perform the encoding method or the decoding method in the foregoing aspects or the possible implementations.

According to another aspect of this application, a computer program is provided. When the computer program runs on a computer, the computer is enabled to perform the encoding method or the decoding method in the foregoing aspects or the possible implementations.

In the embodiments of this application, some or all of frozen bits of a polar code are determined as check frozen bits, and values of the check frozen bits are determined based on values of information bits prior to the check frozen bits. Because the check frozen bit is related to the information bit prior to the check frozen bit, if the information bit prior to the check frozen bit is incorrectly decoded, a value that is of the check frozen bit and that is calculated based on the information bit is more likely to be inconsistent with a received LLR of the check frozen bit, and a metric of the path becomes poorer, so that the incorrect path is more likely to be deleted when metrics of candidate paths are sorted, thereby improving CA-SCL decoding performance.

DESCRIPTION OF EMBODIMENTS

The technical solutions of the embodiments of this application may be applied to a 5G communications system or a future communications system, or may be applied to various other communications systems such as a global system for mobile communications (GSM), a code division multiple access (CDMA) system, a wideband code division multiple access (WCDMA) system, a general packet radio service (GPRS) system, a long term evolution (LTE) system, an LTE frequency division duplex (FDD) system, an LTE time division duplex (TDD) system, and a universal mobile telecommunications system (UMTS).

Figure 1:
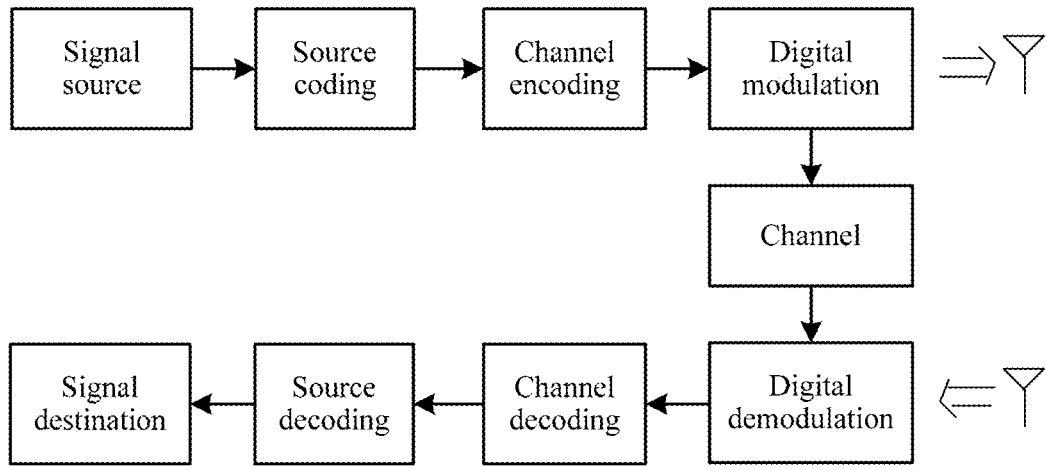
FIG. 1 is a schematic diagram of a basic procedure of wireless communication at a transmit end and a receive end.

FIG. 1 shows a basic procedure of wireless communication. At a transmit end, a signal source is sent after source coding, channel encoding, and digital modulation are sequentially performed. At a receive end, a signal destination is output after digital demodulation, channel decoding, and source decoding are sequentially performed. A polar code may be used for channel encoding/decoding. SC decoding and SCL decoding may be used during channel decoding. The SCL decoding algorithm is an improvement to the SC decoding algorithm. In a decoding process, a plurality of candidate paths are retained, and a path is finally selected as a decoding result based on a metric of each candidate path.

When an $i^{th}$ bit is decoded, a metric $PM_1$ (i), namely, a path metric (PM), of an $1^{th}$ path is shown in formula (1) (it is set that a corresponding value is 0 when LLR>0 or a corresponding value is 1 when LLR<0):

$$PM_l(i) = \begin{cases} PM_l(i-1), & \text{when a value corresponding to an } LLR \text{ is consistent with a decision result} \\ PM_l(i-1) + |LLR_l(i)|, & \text{when a value corresponding to an } LLR \text{ is inconsistent with a decision result} \end{cases} \quad \text{formula (1)}$$

The LLR(i) is a log-likelihood ratio (LLR) of a current bit. The value corresponding to the LLR may be 0 or 1. For example, when LLR<0, the corresponding value is 1; or when LLR>0, the corresponding value is 0. Certainly, in actual application, another manner may alternatively be used. For example, when LLR<0, the corresponding value is set to 0; or when LLR>0, the corresponding value is set to 1. When LLR=0, it may be considered that the value corresponding to the LLR is 0 or 1. This may be set as required in actual application. If the value corresponding to the LLR of the current bit is consistent with the decision result, the PM remains unchanged. If the value (0 or 1) corresponding to the LLR of the current bit is inconsistent with the decision result, the PM is increased by a penalty |LLR(i)|, that is, the penalty is an absolute value of the LLR of the current bit. It can be learned from the formula for calculating the PM that, a smaller PM indicates that a codeword corresponding to the path is closer to a received signal and a metric of the path is better. Therefore, a path with a minimum PM may be finally output as a decoding result. In formula (1), if the value (0 or 1) corresponding to the LLR of the current bit is inconsistent with the decision result, the PM may be decreased by the penalty |LLR(i)|, that is, $PM_1$ (i)=$PM_1$ (i−1)−|LLR(i)|. Correspondingly, selecting a path with the most optimal metric means selecting a path with a maximum PM. In this application, formula (1) is used as an example for description.

In an SCL decoding process, if a current bit is an information bit, each path is extended to two paths, and a total of 2 L paths are obtained through extension, where L is a quantity of candidate paths that finally need to be retained. A decision result at each node is 0 or 1, and a PM of each path is calculated based on the foregoing formula. Then, the paths obtained through extension are sorted based on the PMs, L paths with minimum PMs are retained, and the other L paths are deleted. This is also called pruning. If a current bit is a frozen bit, no path is extended at a corresponding node, the current bit is directly determined as a corresponding known fixed value, and a PM of each path is calculated based on formula (1).

Figure 2A:
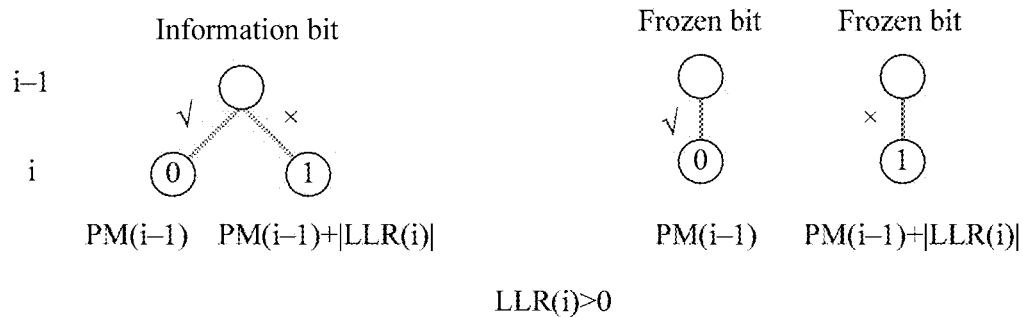
FIG. 2(a) is a schematic diagram of path extension and metric calculation when an LLR of a current bit is greater than 0 according to an embodiment of this application.
Figure 2B:
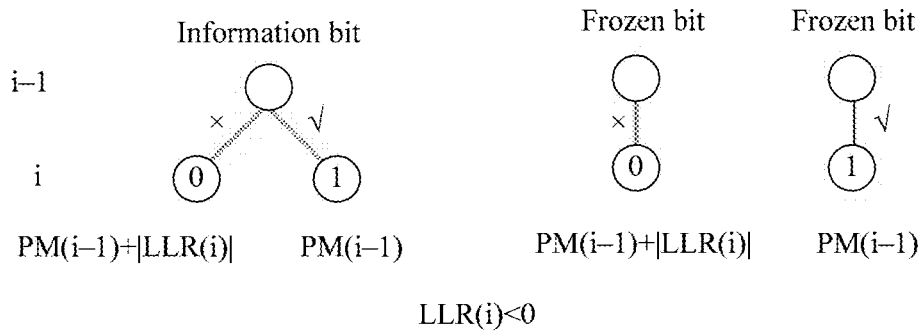
FIG. 2(b) is a schematic diagram of path extension and metric calculation when an LLR of a current bit is less than 0 according to an embodiment of this application.

For ease of description, the following is described by using an example in which a corresponding value is 1 when LLR<0 or a corresponding value is 0 when LLR>0. As shown in FIG. 2(a), if an LLR(i) of a current decoded bit is greater than 0 (a corresponding value is 0), in a path extension process, if the current bit is an information bit, two paths need to be obtained through extension. If a decision result is also 0, the decision result is consistent with the value corresponding to the LLR (which is represented by using "✓" in FIG. 2(a)). In this case, PM(i)=PM(i−1). If a decision result is 1, the decision result is inconsistent with the value corresponding to the LLR (which is represented by using "x" in FIG. 2(a)). In this case, PM(i)=PM(i−1)+|LLR(i)|. If the current bit is a frozen bit, no path extension is performed, and the PM is calculated based on a known fixed value. If the known fixed value is 0, and the value corresponding to the LLR is also 0, the known fixed value is consistent with the value corresponding to the LLR. In this case, PM(i)=PM(i−1). If the known fixed value is 1, the known fixed value is inconsistent with the value corresponding to the LLR. In this case, PM(i)=PM(i−1)+|LLR(i)|. As shown in FIG. 2(b), if an LLR(i) of a current decoded bit is less than 0 (a corresponding value is 1), in a path extension process, if the current bit is an information bit, two paths need to be obtained through extension. If a decision result is 0, the decision result is inconsistent with the value corresponding to the LLR. In this case, PM(i)=PM(i−1)+|LLR(i)|. If a decision result is 1, the decision result is consistent with the value corresponding to the LLR. In this case, PM(i)=PM(i−1). If the current bit is a frozen bit, no extension is performed, and the PM is calculated based on a known fixed value. If the known fixed value is 0, and the value corresponding to the LLR is also 1, the known fixed value is inconsistent with the value corresponding to the LLR. In this case, PM(i)=PM(i−1)+|LLR(i)|. If the known fixed value is 1, the known fixed value is consistent with the value corresponding to the LLR. In this case, PM(i)=PM(i−1).

Figure 3:
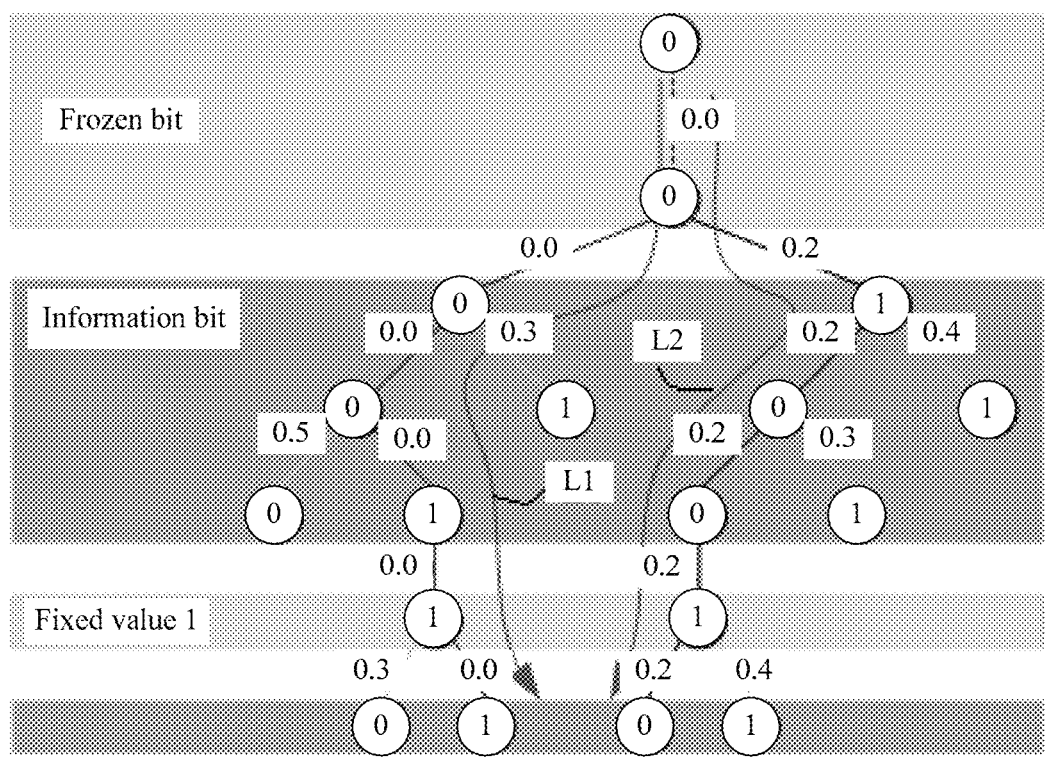
FIG. 3 is a schematic diagram of path extension and PM value update during SCL decoding.

FIG. 3 shows an example of an SCL decoding algorithm in a case of list=2, and two candidate paths are retained in a decoding process. The first several bits are usually frozen bits, and are set to a fixed value such as 0. Therefore, decoding actually starts from the first information bit. In FIG. 2(a) and FIG. 2(b), a path with a minimum PM value is retained in each time of extension, and two candidate paths L1 and L2 shown by arrows are finally obtained. A final PM value of the path L1 is 0.0, and a final PM value of the other path L2 is 0.2. Therefore, the path L1 with a smaller PM 0.0 is selected as a decoding output, and a value of a decoded information bit is 0011. A polar code that is concatenated with CRC (Cyclic Redundancy Check) is referred to as CA-polar for short. In addition, CRC check is performed, so that a path on which the CRC succeeds is selected, as a decoding output, from candidate paths that are output during SCL decoding. A CA-SCL (CRC-Aided Successive Cancellation List) decoding algorithm can significantly improve performance of the polar code.

Figure 4:
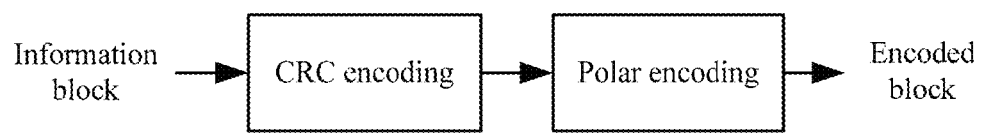
FIG. 4 is a schematic diagram of a CA-polar encoding process.

A construction process of a CA-polar code is as follows: It is assumed that a size of an information block is $K_{info}$, a CRC length is $K_{crc}$, and a mother code length during polar encoding is N. In this case, ($K_{info}$+$K_{crc}$) polar channels with highest reliability need to be selected from N polar channels to carry information bits, and the remaining polar channels are used to carry frozen bits. A CA-polar encoding process is shown in FIG. 4: CRC encoding is first performed on the information block, bits obtained after the CRC encoding are then mapped to locations of the information bits, a fixed value agreed on by a transmit end and a receive end is placed at locations of the frozen bits, and then polar encoding is performed, to obtain an encoded block of the CA-polar. In an SCL decoding process, both the information block and CRC bits are unknown, and decoding is performed based on a normal SCL decoding process. After SCL decoding ends, L candidate decoding results are obtained, and the decoding results each include the information block and CRC bits.

CRC check is performed on each candidate result starting from a path with a minimum PM. If the check succeeds, an information block on the path is used as a decoding output. If the CRC check on all the results fails, an information block on the path with the minimum PM is used as the decoding output, or a decoding failure may be directly indicated.

Figure 5:
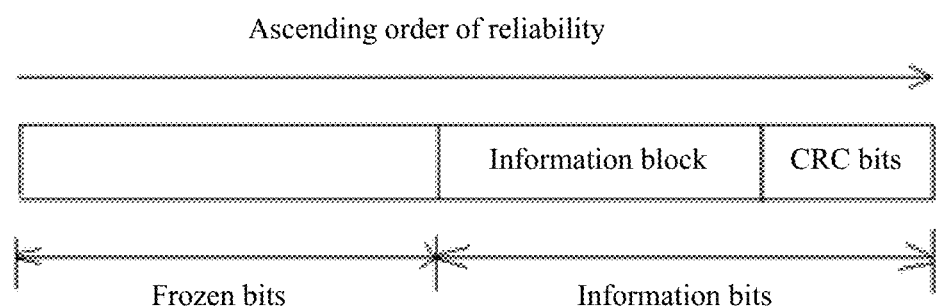
FIG. 5 is a schematic diagram of CA-polar construction.

As shown in FIG. 5, in the CA-polar encoding/decoding process, the CRC bits each are processed as an information bit, and the CRC bit is used to assist in selecting a path when the SCL decoding ends. However, during SCL decoding, a correct path may be deleted due to a relatively large PM at an intermediate node.

In the embodiments of this application, a check frozen bit is added into the CA-polar, and a value of the check frozen bit is determined based on a value of an information bit prior to the check frozen bit, that is, the check frozen bit is used to check the information bit prior to the check frozen bit, and is used to assist in SCL decoding of the CA-polar, so as to improve a probability that an incorrect path is deleted at the intermediate node and improve performance of the CA-polar. The check frozen bit herein is named relative to original frozen bits, and indicates that some of the original frozen bits are selected for placing a value associated with an information bit, that is, the frozen bit is used to check at least one information bit prior to the frozen bit. The check frozen bit may also be referred to as a parity check bit or a parity check frozen bit. In some embodiments, such a frozen bit may also be referred to as a dynamic frozen bit. A location of such a dynamic frozen bit varies with a parameter such as a size of an information block and a code length that are sent each time, and the dynamic frozen bit is not always located at a fixed location. Correspondingly, the other frozen bits may be referred to as static frozen bits. For ease of description, these frozen bits are collectively referred to as the check frozen bit below.

Figure 6:
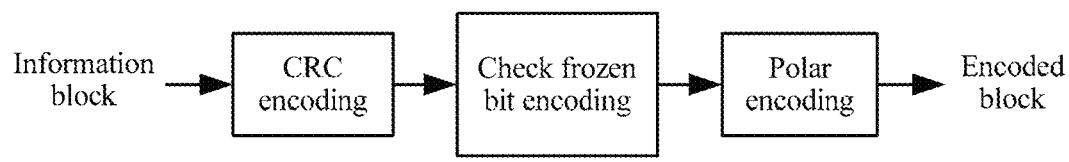
FIG. 6 is a schematic diagram of an encoding process according to an embodiment of this application.

As shown in FIG. 6, an encoding process includes the following:

(1) CRC encoding: Polar channels with high reliability are selected as information bits based on a CA-polar construction algorithm, CRC encoding is performed on an information block, and encoded bits are mapped to the information bits.

(2) Check frozen bit encoding: A check frozen bit is determined in the remaining polar channels, a check equation is constructed, a value of the check frozen bit is calculated based on a value of an information bit and the check equation, and remaining frozen bits are used to place an agreed fixed value.

(3) Polar encoding: Polar encoding is performed on the information bits, the check frozen bit, and the remaining frozen bits, to obtain a polar encoded block.

At a receive end, decoding is performed by using an SCL decoding algorithm. The check frozen bit is processed as a frozen bit, and no path extension is performed. However, the value of the check frozen bit is determined based on a value of a decoded information bit prior to the check frozen bit and the check equation. After SCL decoding ends, L candidate paths are obtained, and CRC is performed, so that a path on which the CRC check succeeds is selected from the candidate paths as a decoding output. During decoding, CRC may be not only used to select a decoding result from the candidate paths, but also used to detect an error, that is, determine whether the decoding result is correct.

Because the value of the check frozen bit is determined based on the value of the decoded information bit prior to the check frozen bit and the check equation, once the decoded information bit prior to the check frozen bit is incorrect, when the check frozen bit is decoded, the value that is of the check frozen bit and that is calculated by using the information bit is more likely to be inconsistent with a value corresponding to a received LLR. Correspondingly, when a PM value of the path is calculated, the PM value is increased by an absolute value of the LLR of the check frozen bit through calculation based on formula (1). Therefore, the PM value of the path is increased, and the path is more likely to be deleted in a subsequent decoding process.

Figure 7:
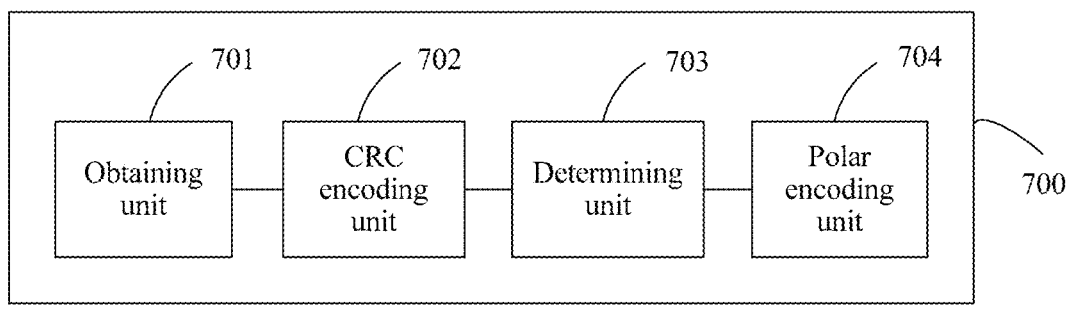
FIG. 7 is a schematic structural diagram of an encoding apparatus according to an embodiment of this application.
Figure 8:
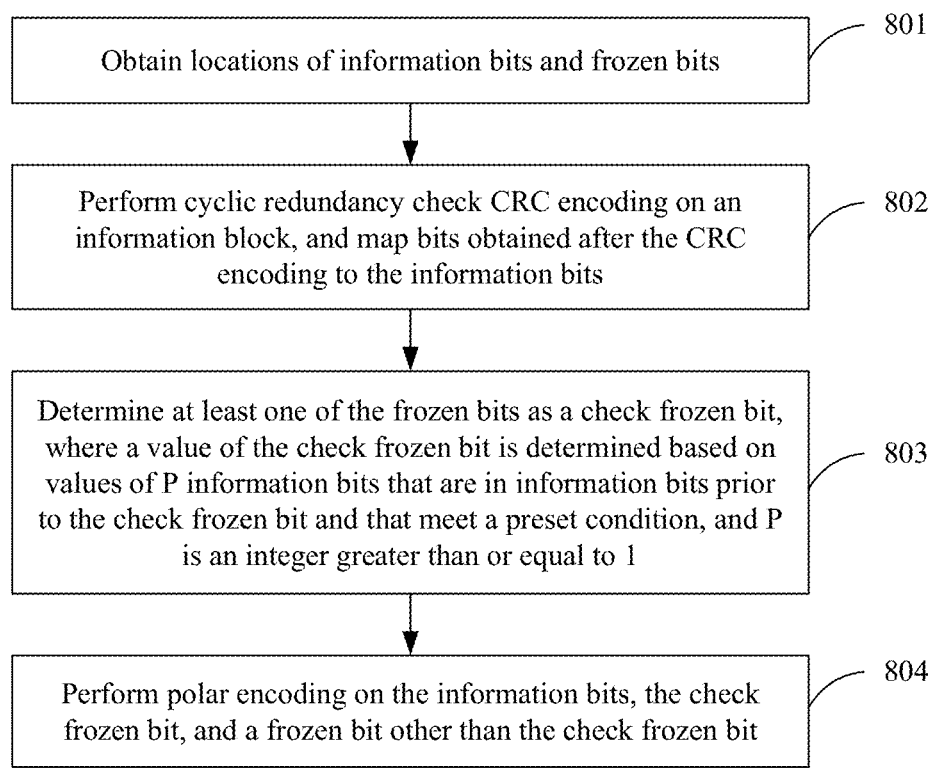
FIG. 8 is a schematic flowchart of an encoding method according to an embodiment of this application.

An encoding apparatus 700 shown in FIG. 7 may perform an encoding method. As shown in FIG. 8, an encoding method in an embodiment of this application may include the following processes.

801. Obtain locations of information bits and frozen bits.

An obtaining unit 701 obtains the locations of the information bits and the frozen bits based on a reliability order of polar channels. Reliability of a polar channel corresponding to the information bit is higher than reliability of a polar channel corresponding to the frozen bit. Specifically, the obtaining unit 701 selects, as the information bits, ($K_{info}$+ $K_{crc}$) polar channels with highest reliability from the polar channels based on the reliability order of the polar channels. $K_{info}$ is a size of a to-be-encoded information block, and $K_{crc}$ is a quantity of CRC bits. The remaining polar channels are used as the frozen bits.

802. Perform cyclic redundancy check CRC encoding on an information block, and map bits obtained after the CRC encoding to the information bits.

A CRC encoding unit 702 performs CRC encoding on the information block, to obtain ($K_{info}$+$K_{crc}$) bits obtained after the CRC encoding, and maps the bits to the information bits.

803. Determine at least one of the frozen bits as a check frozen bit, where a value of the check frozen bit is determined based on values of P information bits that are in information bits prior to the check frozen bit and that meet a preset condition, and P is an integer greater than or equal to 1.

A determining unit 703 determines, as the check frozen bit, the at least one of the frozen bits determined in step 801. The value of the check frozen bit is determined based on the values of the P information bits that are in the information bits prior to the check frozen bit and that meet the preset condition, and P is an integer greater than or equal to 1. The check frozen bit herein indicates that the value of the bit is related to a value of another bit. In an embodiment of this application, an information bit instead of a frozen bit is selected as the another bit. The "check frozen bit" is named to differ from an existing frozen bit (a fixed bit), and may also have another name such as a dynamic frozen bit or a parity check bit. Due to a feature of a polar code, the first several polar channels with smallest sequence numbers usually have lowest reliability. Therefore, the first several polar channels of the polar code are usually used as frozen bits, that is, there are usually one or more frozen bits prior to the first information bit. If the check frozen bit is used to check an information bit prior to the check frozen bit, because there is no information bit prior to the initial frozen bits, the frozen bits cannot be used as check frozen bits. A value of a frozen bit other than the check frozen bit is set to a fixed value known to a transmit end and a receive end, for example, 0 or 1.

804. Perform polar encoding on the information bits, the check frozen bit, and a frozen bit other than the check frozen bit.

A polar encoding unit 704 performs Arikan polar encoding on the information bits, the check frozen bit, and the frozen bit other than the check frozen bit, to obtain an encoded block. The encoded block may also be referred to as an encoded sequence, an encoded codeword, or the like.

Figure 9:
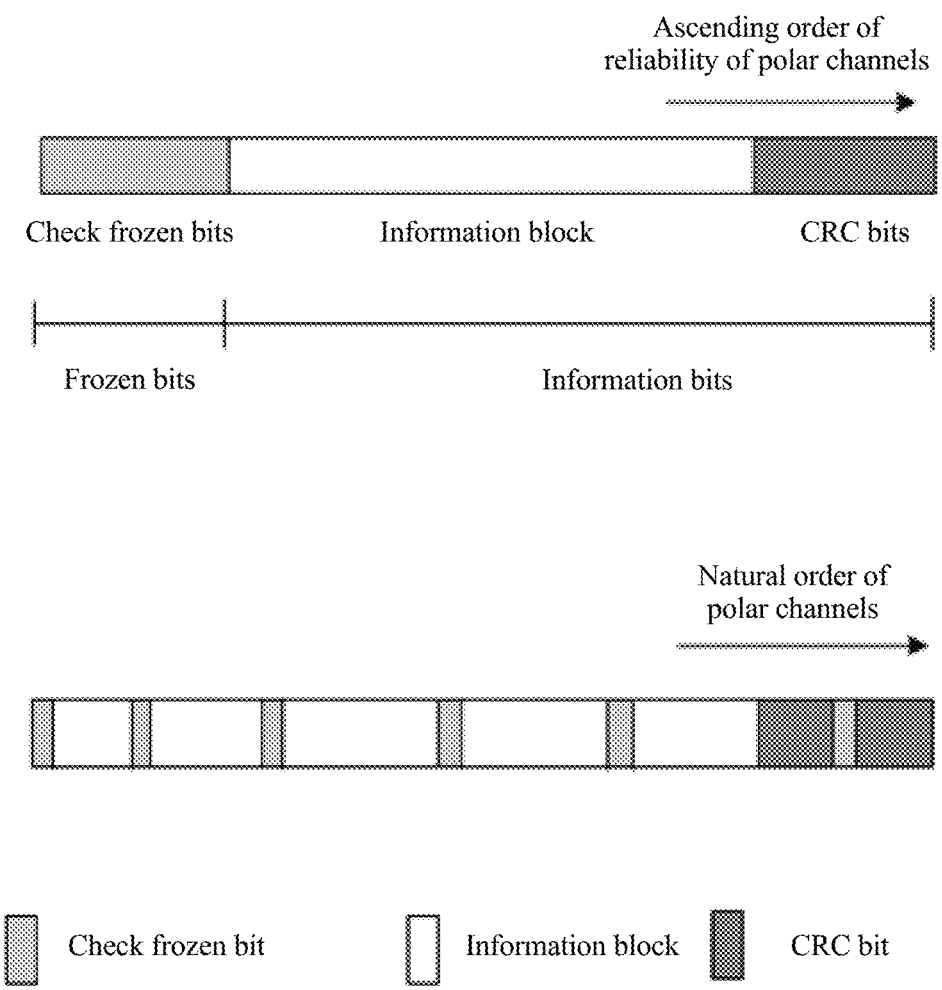
FIG. 9 is a schematic diagram of CA-polar construction according to an embodiment of this application.

The check frozen bit in this application is selected from the frozen bits, and based on the reliability order of the polar channels, the polar channel corresponding to the frozen bit is less reliable than that corresponding to the information bit. As shown in FIG. 9, in a polar code constructed in this embodiment of this application, the information block and the CRC bits are jointly distributed on polar channels with highest reliability, and check frozen bits (check bits) are distributed on polar channels that are less reliable than that corresponding to the information bit. If a natural order is used, the check frozen bits are scattered in the information block and the CRC bits. With introduction of the check frozen bit, decoding accuracy can be improved without sacrificing performance of existing CA-polar.

In step 803, a manner in which the at least one of the frozen bits is determined as the check frozen bit may be as follows: All of the frozen bits are used as check frozen bits. However, if there is no information bit prior to a check frozen bit (for example, after the polar channels are sorted in the natural order (an encoding order) shown in FIG. 9, there is no information bit prior to the first check frozen bit), the check frozen bit is processed in an original manner, that is, still remains as a frozen bit, and is set to the fixed value known to the transmit end and the receive end. Alternatively, some of the frozen bits may be selected as check frozen bits based on a specific condition, and not all of the frozen bits are check frozen bits by default.

Figures 10, 11:
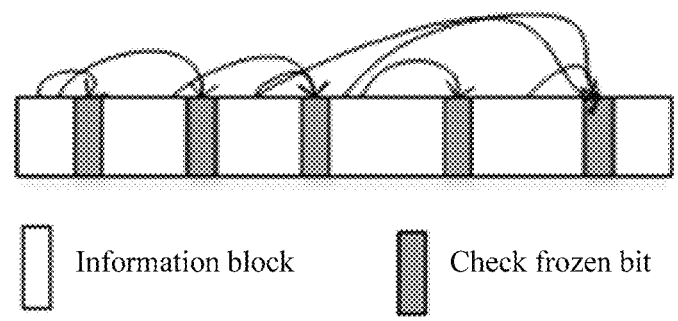
FIG. 10 is a schematic diagram of a check relationship between each dynamic check bit and an information bit prior to the dynamic check bit according to an embodiment of this application.
FIG. 11 is a schematic structural diagram of another encoding apparatus according to an embodiment of this application.

Each frozen bit is determined with reference to an information bit prior to the frozen bit. As shown in FIG. 10, a check frozen bit may be determined with reference to one or more information bits prior to the check frozen bit. To be specific, a value of the check frozen bit may be determined based on the one or more information bits prior to the check frozen bit. Check equations (check functions) may be constructed on an encoding side and a decoding side according to a same rule. Because objects processed during channel encoding are 0 and 1, a parity check manner may be used when the check frozen bit is used to check the information bit prior to the check frozen bit. For example, when a frozen bit is used to check (is determined with reference to) one information bit prior to the frozen bit, a value of the information bit is assigned to the check frozen bit on the encoding side. If a check frozen bit is used to check two information bits prior to the check frozen bit, a value obtained after a binary addition (exclusive OR) operation is performed on values of the two information bits is assigned to the check frozen bit.

The P information bits that meet the preset condition may be determined in a plurality of manners. In an embodiment, an information bit that participates in determining a value of a frozen bit may be selected based on an agreed value Q, where Q is an integer greater than 1. For example, an information bit that is prior to a check frozen bit and whose sequence number is the same as a value obtained after a sequence number of the check frozen bit mod Q is selected as an information bit that participates in check performed by using the check frozen bit. For example, Q=5, and it is assumed that a polar channel $U_{18}$ is determined as a check frozen bit. In this case, information bits on polar channels $U_{13}$, $U_8$, and $U_3$ are used as information bits that participate in determining a value of $U_{18}$, that is, $U_{18}=U_3+U_8+U_{13}$. If $U_3$ is not an information bit, $U_3$ does not participate in check, and the check equation is changed to $U_{18}=U_8+U_{13}$. If none of $U_{13}$, $U_8$, and $U_3$ is an information bit, the check equation is changed to $U_{18}$=0, and $U_{18}$ still remains as a frozen bit. Due to an SC sequential decoding feature of the polar code, the check frozen bit is used to check an information bit prior to the check frozen bit. Therefore, because a frozen bit prior to the first information bit has no information bit that can be checked, the frozen bit still remains as a frozen bit. A value of Q herein may be determined based on a parameter such as a mother code length. For example, a larger code length may indicate a larger value of Q. Q may be alternatively agreed to be a prime number or an odd number. For example, Q may be 3, 5, 7, or 9. In hardware implementation, an information bit that participates in check may be read by using a shift register. If Q is a prime number, this is implemented by using a prime shift register. A combined solution may alternatively be used for the check equation. For example, an information bit whose sequence number is the same as a value obtained after a sequence number of the check frozen bit mod Q or M is selected to participate in check. For example, if Q=5 and M=7, $U_{18}=U_3+U_8+U_{13}+U_{11}+U_4$. Similarly, if a bit selected by using the check equation is not an information bit, the information bit does not participate in determining the value of the check frozen bit. In another optional manner, the P information bits that meet the preset condition may be agreed to be all information bits that are prior to the check frozen bit and whose sequence numbers are odd numbers or prime numbers. The P information bits may alternatively be determined in the following manner: An information bit whose sequence number is the same as a value obtained after a sequence number of the check frozen bit mod Q1, Q2, . . . , or Qh is selected to participate in determining the value of the check frozen bit, where h is an integer greater than or equal to 2, and Q1, Q2, . . . , and Qh are respectively integers greater than or equal to 1 and different from each other. To be specific, when information bits that participate in determining the value of the check frozen bit are determined by performing a modulo operation, one number such as 5 may be used to perform a modulo operation. Alternatively, the P information bits may be determined by performing a modulo operation on the sequence number of the check frozen bit by simultaneously using two or more numbers. For example, information bits corresponding to all sequence numbers that are the same as a value obtained after the sequence number of the check frozen bit mod 3, 5, or 7 are all used to determine the value of the check frozen bit.

In an embodiment, the P information bits that meet the preset condition may be randomly determined, that is, a check equation of each frozen bit may be randomly constructed. For example, a random number is generated based on an agreed random seed, to determine whether each information bit prior to a check frozen bit participates in check performed by using the check frozen bit. For example, numbers evenly distributed in (0, 1) are generated based on the agreed random seed. The numbers may be decimals or fractions, and may include numbers greater than 0 and less than 1, or may include 0 or 1. For each check frozen bit, a random number is generated for each information bit prior to the check frozen bit by using the random seed. If the random number is less than a threshold T, the information bit participates in determining a value of the check frozen bit. If the number is greater than or equal to the threshold T, the information bit does not participate in determining the value of the check frozen bit. A same random number may be generated by using a same random seed at the transmit end and the receive end, so as to ensure consistency between an encoding configuration and a decoding configuration. A value of T is a number greater than 0 and less than 1, for example, may be set to a number equal to or approximately equal to ⅓ or ⅕. A probability that an information bit participates in check and complexity of each check equation depend on the threshold T. Herein, a larger value of T indicates a higher probability that an information bit participates in check and a more complex check equation of each check frozen bit.

The P information bits that meet the preset condition may be simply set as one information bit, that is, P=1. A single-bit check equation is constructed, and each check frozen bit is used to check only one information bit prior to the check frozen bit, that is, a value of each check frozen bit is determined based on only a value of the information bit prior to the frozen bit. Due to a kernel structure of Arikan polar, checking information bits whose sequence number difference is $2^m$ may not produce a performance gain. Therefore, when single-bit check is performed, an information bit that is prior to the check frozen bit, that is closest to the check frozen bit, and that is not at a distance of $2^m$ may be selected as an information bit that participates in determining the value of the check frozen bit, where m herein is an integer greater than or equal to 0. In the natural order of the polar channels, the selected one information bit is closest to the check frozen bit, and a difference between a sequence number of the check frozen bit and a sequence number of the one information bit is not equal to an integer power of 2.

Figures 19, 20:
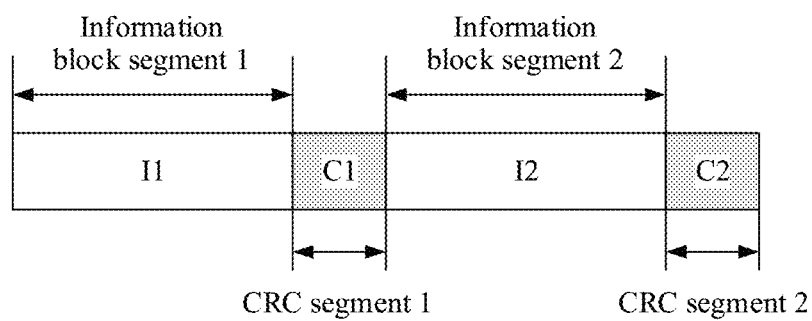
FIG. 19 is an encoding matrix of a polar code whose mother code length is 32.
FIG. 20 is a schematic diagram of a segment-based CRC encoding principle according to an embodiment of this application.

Selecting the P information bits that meet the preset condition may mean selecting an information bit that can increase a code distance of a polar channel corresponding to the check frozen bit. The check frozen bit improves performance of the polar mainly by increasing a code distance of the polar code. A code weight of the Arikan polar code may be calculated as a quantity of 1s in a row (which is also referred to as a row vector) in which each information bit is located in an encoding matrix. For example, an encoding matrix $G_{32}$ of a polar code whose mother code length is 32 is shown in FIG. 19.

A row in which the fifteenth bit $U_{15}$ is located in the encoding matrix is as follows:

$$R_{15}=[1\ 0\ 1\ 0\ 1\ 0\ 1\ 0\ 1\ 0\ 1\ 0\ 1\ 0\ 1\ 0\ 0\ 0\ 0\ 0\ 0\ 0\ 0\ 0\ 0\ 0\ 0\ 0\ 0\ 0\ 0].$$

There are eight 1s in $R_{15}$, that is, the code weight of the bit is 8. If a polar channel corresponding to $U_{15}$ is an information bit with a smallest code weight in all information bits, a minimum code distance of the polar code is 8. If $U_{18}$ is used to check the information bit, a check equation is $U_{18}=U_{15}$. A row in which $U_{18}$ is located in the encoding matrix is as follows:

$$R_{18}=[1\ 0\ 0\ 0\ 0\ 0\ 0\ 0\ 0\ 0\ 0\ 0\ 0\ 0\ 0\ 1\ 1\ 0\ 0\ 0\ 0\ 0\ 0\ 0\ 0\ 0\ 0\ 0\ 0\ 0\ 0].$$

Based on a binary feature, the check equation is equivalent to $U_{15}+U_{18}=0$. Corresponding to polar encoding, encoding of the frozen bit is equivalent to $U_{15}*R_{15}+U_{18}*R_{18}=U_{15}*(R_{15}+R_{18})$. To be specific, for the frozen bit $U_{18}$, equivalent encoding is as follows:

$$R_{15}+R_{18}=[0\ 1\ 1\ 0\ 1\ 0\ 1\ 0\ 1\ 0\ 1\ 0\ 1\ 0\ 1\ 1\ 0\ 0\ 0\ 0\ 0\ 0\ 0\ 0\ 0\ 0\ 0\ 0\ 0\ 0\ 0].$$

A quantity of 1s in a row vector obtained by $R_{15}+R_{18}$ is 10, that is, the check equation can increase the code weight from 8 to 10. A check equation that can increase a code weight can improve the performance of the polar code. For a frozen bit, if at least one information bit prior to the frozen bit meets the following condition: a quantity of 1s in a row vector obtained by adding a row in which the at least one information bit is located in an encoding matrix and a row in which the check frozen bit is located in the encoding matrix is greater than a quantity of 1s in the row vector in which the information bit is located in the encoding matrix, the check frozen bit that meets the condition may be referred to as a valid check frozen bit. Therefore, an information bit prior to a check frozen bit may be used to determine whether the check frozen bit is valid. Correspondingly, the P information bits that meet the preset condition may be information bits that meet the condition. After the P information bits are obtained by using the foregoing method, only a bit that is in the P information bits and that meets the condition is selected to participate in determining the value of the corresponding check frozen bit. If no information bit meets the condition, the check frozen bit is invalid, and the check frozen bit still remains as a frozen bit, and is set to a known fixed value.

In this embodiment of this application, it is not necessary to select all of the frozen bits as check frozen bits. Instead, only some of the frozen bits may be selected as check frozen bits. In this case, a rule of determining a check frozen bit may be selecting a valid check frozen bit that meets the foregoing condition. In implementation, for each information bit, a valid check frozen bit may be searched for, and then a check equation is constructed. Alternatively, each frozen bit may be first processed as a check frozen bit, for each check frozen bit, a valid information bit prior to the check frozen bit is searched for, and then a check equation is constructed. For example, for a check frozen bit, three valid information bits prior to the check frozen bit are found. All of the three information bits may participate in determining the check frozen bit, or an information bit may be determined in a single-bit check manner, determined by using a random seed, or determined after a sequence number mod Q.

In the encoding methods in the embodiments in FIG. 6 and FIG. 8 of this application, CRC encoding may be performed on the information block by using a plurality of different methods. Correspondingly, there are also different CRC check methods and decoding outputs in a decoding method in an embodiment in FIG. 14. Three CRC encoding manners and corresponding check methods are listed below.

(i) Single CRC block encoding: One time of CRC encoding is performed on the information block with the length $K_{info}$, to obtain bits obtained after the CRC encoding, where the bits include the information block and $K_{CRC}$ CRC bits, and then the bits obtained after the encoding are mapped to the information bits. During decoding, the $K_{CRC}$ CRC bits are not only used to select a decoding result from candidate paths, but also used to determine whether the decoding result is correct, that is, detect an error.

(ii) Segment-based CRC encoding: The information block is divided into a plurality of segments, CRC encoding is performed on each segment of the information block, and then all segments of encoded bits are mapped to the locations of the information bits. During decoding, CRC check is performed on each segment, so as to select a decoding result, and detect an error. An advantage of using the method is that segment-based check can be performed when CRC check is performed on a plurality of candidate decoding paths during SCL decoding. For example, as shown in FIG. 20, it is assumed that the information block is divided into two segments, and the CRC bits are also divided into two segments. In this case, a structure of the information block and the CRC bits is approximately [I1 C1 I2 C2], where I1 and I2 are two information bit segments obtained through division, C1 and C2 are two CRC segments obtained through division, C1 is used to check I1, and C2 is used to check I2 or [I1, I2]. When CRC check is performed on the decoding side, if it is found that the check on I1 fails, there is no need to check I2, thereby saving a check time. When the check on both C1 and C2 succeeds, it indicates that the CRC check on the path succeeds. In the example herein, both the information block and the CRC bits are divided into two segments. In actual application, a specific quantity of segments obtained through division may be randomly set.

(iii) Multi-level CRC encoding: In addition to the $K_{CRC}$ CRC bits in the manners (i) and (ii), $K'_{CRC}$ bits are further selected for CRC encoding, that is, there is a total of $(K_{CRC}+K'_{CRC})$ CRC bits.

During CRC encoding, overall CRC encoding is performed on the information block, to obtain bits obtained after the CRC encoding, where the bits include the information block and the $(K_{CRC}+K'_{CRC})$ CRC bits, and the bits obtained after the encoding are mapped to the locations of the information bits, where $K'_{CRC}$ is an additional CRC length. Adding the CRC length and an existing CRC length can compensate for degradation of error detection performance that is caused by SCL decoding. A value of the added CRC length can vary with a list value. During decoding, the $(K_{CRC}+K'_{CRC})$ CRC bits may be not only used to select a decoding result from candidate paths, but also used to detect an error.

In another implementation, during CRC encoding, first-level CRC encoding is first performed on the information block, to obtain $K_{CRC}$ CRC bits; second-level CRC encoding is performed by using the encoded bits as an entire block, to obtain additional $K'_{CRC}$ CRC bits; and then the bits obtained after the second-level encoding are mapped to the information bits. It may be agreed that one type of CRC bit is used to select a path, that is, correct an error, and the other type of CRC bit is used to detect an error. During decoding, an error correction CRC bit is first used to select a decoding result from a plurality of candidate paths, and the decoding result includes the information block and an error detection CRC bit. Then, error detection is performed on the decoding result by using the error detection CRC bit.

In the multi-level CRC encoding, $K_{CRC}$ is a quantity of basic CRC bits. For example, in LTE, $K_{CRC}$ on a PBCH is defined as 16 bits, and a transmission data block on a PDSCH is defined as 24 bits. The basic bit herein may be indicated at a MAC layer in a system. Other lengths may be defined for the basic CRC bit in different communications systems. Herein, $K'_{CRC}$ is a quantity of additional CRC bits. For example, when SCL decoding is used for a polar code, a larger list value indicates a larger quantity L of selected paths, and a path on which CRC check succeeds is selected from the L candidate paths as a correct decoding result. A check capability of a CRC bit with a shorter length is lower than an error detection capability of a CRC bit with a longer length. Therefore, when a list has a larger value, better error detection performance cannot be achieved by using a same CRC length. Therefore, when the list has a larger value, a length of the additional CRC bit may be appropriately increased. For example, when list=8, it indicates that L=8 candidate paths are selected, and it may be determined that $K'_{CRC}=\log_2(L)=3$. Similarly, when list=16, $K'_{CRC}=4$. In implementation, the length of the additional CRC bit may alternatively be determined according to another rule, and the calculation manner herein imposes no limitation.

Figure 21:
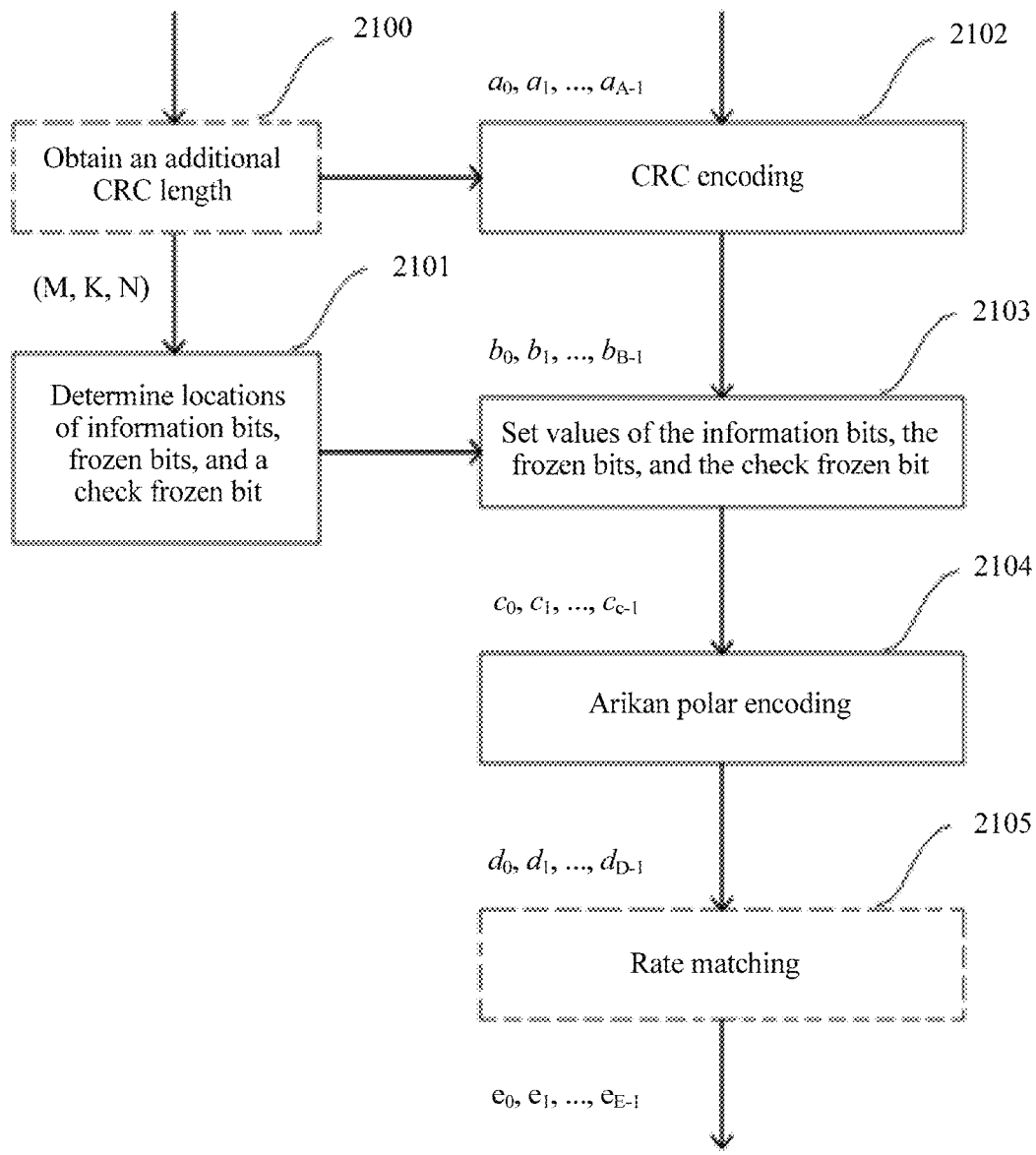
FIG. 21 is a schematic flowchart of another encoding method according to an embodiment of this application.

FIG. 21 is a schematic flowchart of another encoding method according to an embodiment of this application. The method may be performed by the encoding apparatus shown in FIG. 7, FIG. 11, or FIG. 12. The method includes the following steps.

2101. Obtain locations of information bits, frozen bits, and a check frozen bit. This step may be performed by the obtaining unit 701 in FIG. 7, a processor 1102 in FIG. 11, or a signal processor 1202 in FIG. 12.

The locations of the information bits, the frozen bits, and the check frozen bit are obtained based on a target code length M, a mother code length N, and a quantity K of information bits. For example, based on a reliability order of polar channels, the first K bits with highest reliability are selected as the information bits, and the remaining bits are used as the frozen bits. The location of the check bit is determined in the frozen bits based on the foregoing method. Herein, $K=K_{info}+K_{crc}$, where $K_{info}$ is a size of an information block, and $K_{crc}$ is a quantity of CRC bits (or may be referred to as a length of a CRC block).

2102. Perform CRC encoding on an information block. This step may be performed by the CRC encoding unit 701 in FIG. 7, the processor 1102 in FIG. 11, or the signal processor 1202 in FIG. 12.

It is assumed that $A=K_{info}$, $B=K_{info}+K_{crc}$, and an input of the CRC encoding is a sequence $a_0, a_1, a_2, \ldots, a_{A-1}$. In this case, check bits generated after the CRC encoding are $p_0, p_1, p_2, \ldots p_{K_{crc}-1}$, and a sequence that is output after the CRC encoding is $b_0, b_1, \ldots, b_{B-1}$. The sequence obtained after the CRC encoding meets formula (2):

$$\begin{cases} b_k = a_k & \text{for } k = 0, 1, 2, \ldots, A-1 \\ b_k = p_{k-A} & \text{for } k = A, A+1, A+2 \ldots, B-1 \end{cases} \quad \text{formula (2)}$$

2103. Set values of the information bits, the frozen bits, and the check frozen bit, to obtain a to-be-encoded sequence $c_0, c_1, c_2, \ldots, c_{C-1}$, where C=N (the mother code length). Values of the sequence $c_0, c_1, c_2, \ldots, c_{C-1}$ are represented by the following formula (3). This step may be performed by the determining unit 703 in FIG. 7, the processor 1102 in FIG. 11, or the signal processor 1202 in FIG. 12.

$$\begin{cases} c_i = b_i & \text{for } i \in \text{information bit} \\ c_i = 0 & \text{for } i \in \text{frozen bit} \\ c_i = f(b_i) & \text{for } i \in \text{check frozen bit,} \\ & f(\cdot) \text{represents a check equation} \end{cases} \quad \text{formula (3)}$$

2104. Perform Arikan polar encoding, and output an encoded sequence $d_0, d_1, d_2, \ldots, d_{D-1}$, where D=N. A calculation process for polar encoding may be represented by the following formula (4). This step may be performed by the polar encoding unit 704 in FIG. 7.

$$[d_0, d_1, d_2, \ldots, d_{D-1}] = [c_0, c_1, c_2, \ldots, c_{C-1}] \cdot F_2^{\otimes n},$$
where, $n=\log_2 N$ \hfill formula (4).

Optionally, the method may further include step 2105, where rate matching is performed on the encoded sequence, and an encoded sequence $e_0, e_1, \ldots, e_{E-1}$ obtained after the rate matching is output, where E=M. If the target code length is different from the mother code length, rate matching is performed on the encoded sequence obtained in step 2104. For example, rate matching is performed through repetition, shortening, or puncturing. When the mother code length N is less than the target code length M, (M−N) bits may be repeated for the encoded sequence, to obtain an encoded sequence with the target code length M. If the mother code length N is greater than the target code length M, (N−M) bits may be punctured or shortened, to obtain an encoded sequence with the target code length M. A puncturing or shortening solution may be preset. Step 2105 may be performed by a rate matching unit (not shown in the figure) in the encoding apparatus in FIG. 7, the processor 1102 in FIG. 11, or the signal processor 1202 in FIG. 12.

If an additional CRC bit is used for CRC encoding, before step 2101, step 2100 of obtaining an additional CRC length is further included. The additional CRC length J' is determined based on an actual encoding status, where $K_{crc}=J+J'$, and J is a fixed CRC length (a basic CRC length). Step 2101 may be performed by the obtaining unit 701 in FIG. 7, the processor 1102 in FIG. 11, or the signal processor 1202 in FIG. 12.

Figure 14:
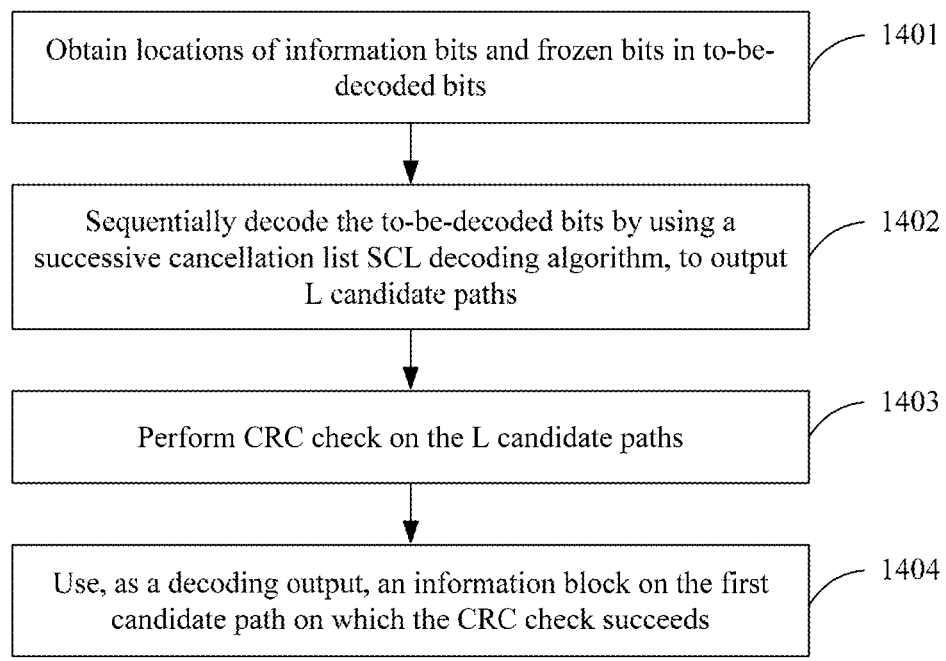
FIG. 14 is a schematic flowchart of a decoding method according to an embodiment of this application.
Figure 22:
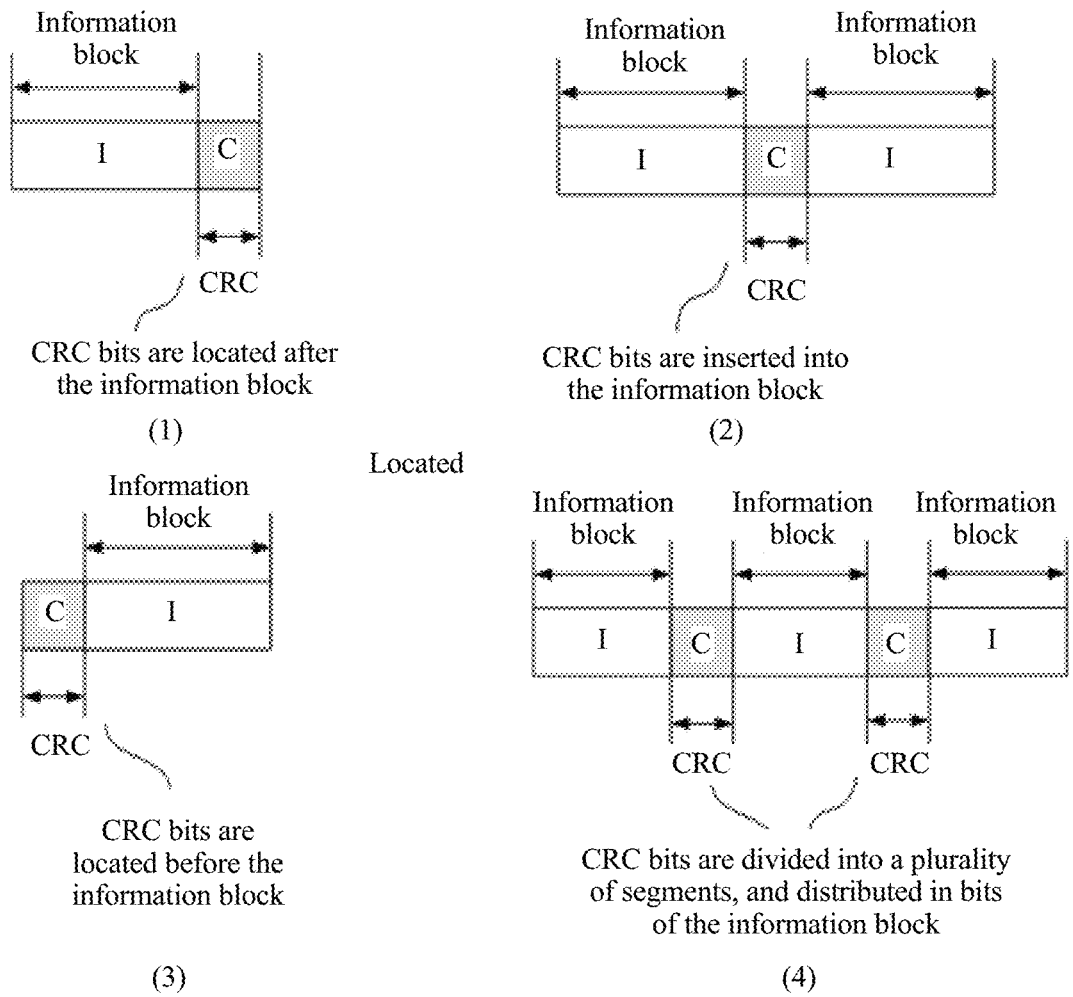
FIG. 22 is a schematic diagram of a location relationship between CRC bits and an information block in bits obtained after CRC encoding according to an embodiment of this application.

In the encoding methods in the embodiments in FIG. 6, FIG. 8, and FIG. 21 of this application, the bits obtained after the CRC encoding may be mapped to the information bits in a plurality of manners. Correspondingly, the decoding result in the decoding method in the embodiment in FIG. 14 is also processed differently. When being mapped to the information bits, the information block and the CRC bits may be interleaved. Correspondingly, during decoding, an SCL decoding result is first de-interleaved, and then path selection and error detection are performed through CRC check. As shown in FIG. 22, the bits obtained after the CRC encoding include the information block and the CRC bits, and the information block and the CRC bits may be sorted and mapped to the locations of the information bits in the following four manners. The CRC bits herein include a single CRC block, a CRC segment, the additional CRC bit, and the basic CRC bit that are in the foregoing CRC encoding manners (i), (ii), and (iii).

(1) The CRC bits are located after the information block, as shown in (1) in FIG. 22.

(2) The CRC bits are located before the information block, as shown in (3) in FIG. 22.

(3) The CRC bits are inserted into the information block, as shown in (2) in FIG. 22.

(4) The CRC bits are divided into a plurality of segments, and each segment is inserted into the information block, is located before the information block, or is located after the information block, as shown in (4) in FIG. 22.

As shown in FIG. 11, this application provides another encoding apparatus 1100 that may implement the encoding method in this application. The encoding apparatus 1100 includes:

a memory 1101, configured to store a program; and a processor 1102, configured to: execute the program stored in the memory, and when executing the program, perform the encoding method shown in FIG. 8. For example, the method includes: obtaining locations of information bits and frozen bits based on a reliability order of polar channels, where reliability of a polar channel corresponding to the information bit is higher than reliability of a polar channel corresponding to the frozen bit; performing cyclic redundancy check CRC encoding on an information block, and mapping bits obtained after the CRC encoding to the information bits; determining at least one of the frozen bits as a check frozen bit, where a value of the check frozen bit is determined based on values of P information bits that are in information bits prior to the check frozen bit and that meet a preset condition, and P is an integer greater than or equal to 1; and performing polar encoding on the information bits, the check frozen bit, and a frozen bit other than the check frozen bit.

The encoding method has been described in the foregoing method embodiment, and the processor is only configured to perform the encoding method based on the program. Therefore, for detailed descriptions of the encoding method, refer to FIG. 8 and related parts in the embodiment corresponding to FIG. 8. Details are not described herein again.

For content such as a manner of determining the check frozen bit and how to select the P information bits, refer to the foregoing encoding method. The memory 1101 may be a physically independent unit, or may be integrated into the processor 1102.

The encoding apparatus in FIG. 11 may further include a transmitter (not shown in the figure), configured to send an encoded block obtained after the processor 1102 performs polar encoding on the information bits and the check frozen bit.

Figure 12:
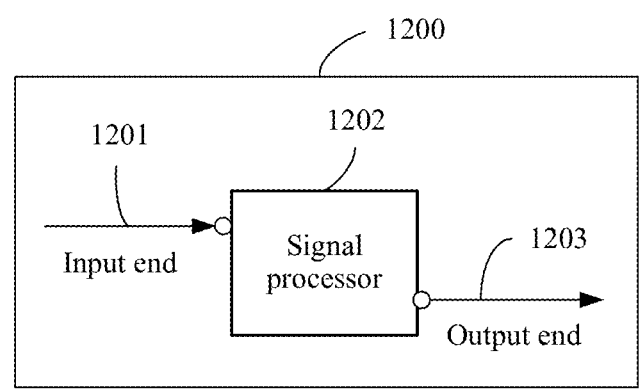
FIG. 12 is a schematic structural diagram of another encoding apparatus according to an embodiment of this application.

As shown in FIG. 12, this application provides another encoding apparatus 1200 that may implement the encoding method in this application. The encoding apparatus 1200 includes:

at least one input (input) end 1201, configured to receive an information block;

a signal processor 1202, configured to: obtain locations of information bits and frozen bits based on a reliability order of polar channels, where reliability of a polar channel corresponding to the information bit is higher than reliability of a polar channel corresponding to the frozen bit; perform cyclic redundancy check CRC encoding on the information block, and map bits obtained after the CRC encoding to the information bits; determine at least one of the frozen bits as a check frozen bit, where a value of the check frozen bit is determined based on values of P information bits that are in information bits prior to the check frozen bit and that meet a preset condition, and P is an integer greater than or equal to 1; and perform polar encoding on the information bits, the check frozen bit, and a frozen bit other than the check frozen bit; and at least one output (output) end 1203, configured to output an encoded block obtained by the signal processor 1202.

For content such as a manner of determining the check frozen bit and how to select the P information bits, refer to the foregoing encoding method.

Optionally, the signal processor 1202 may be implemented by hardware, for example, a baseband processor, a processing circuit, an encoder, or an encoding circuit.

The encoding method has been described in the foregoing method embodiment, and the signal processor 1202 is only configured to perform the encoding method. Therefore, for detailed descriptions of the encoding method, refer to FIG. 8 and related parts in the embodiment corresponding to FIG. 8. Details are not described herein again.

The encoding apparatus in FIG. 12 may further include a transmitter (not shown in the figure), configured to send the encoded block that is output by the output (output) end 1203.

The encoding apparatus in this application may be any device with a wireless communication function, for example, an access point, a station, user equipment, or a base station.

Figure 13:
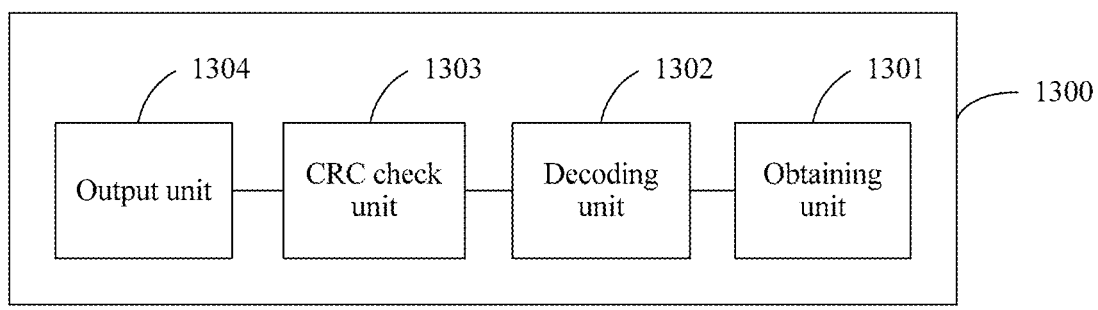
FIG. 13 is a schematic structural diagram of a decoding apparatus according to an embodiment of this application.

A decoding apparatus 1300 shown in FIG. 13 may be configured to perform the decoding method in this application. As shown in FIG. 14, a decoding process includes the following processes.

1401. Obtain locations of information bits and frozen bits in to-be-decoded bits, and determine at least one of the frozen bits as a check frozen bit.

An obtaining unit 1301 obtains the locations of the information bits and the frozen bits based on a reliability order of polar channels. Reliability of a polar channel corresponding to the information bit is higher than reliability of a polar channel corresponding to the frozen bit. Specifically, the obtaining unit 1301 selects, as the information bits, ($K_{info}+K_{crc}$) polar channels with highest reliability from the polar channels based on the reliability order of the polar channels. $K_{info}$ is a size of an information block, and $K_{crc}$ is a quantity of CRC bits. The remaining polar channels are used as the frozen bits. The obtaining unit 1301 determines the at least one of the frozen bits as the check frozen bit.

1402. Sequentially decode the to-be-decoded bits by using a successive cancellation list SCL decoding algorithm, to output L candidate paths, where a value of the check frozen bit on each path is determined based on values of P information bits that are in information bits prior to the check frozen bit and that meet a preset condition, and P is an integer greater than or equal to 1. A location of the check frozen bit, an information bit used to determine the value of the check frozen bit, and construction of a check equation are the same as those on an encoding side.

A decoding unit 1302 sequentially decodes the to-be-decoded bits by using the successive cancellation list SCL decoding algorithm, to output the L candidate paths with optimal metrics. A decoding result on each candidate path includes an information block and cyclic redundancy check CRC bits.

In an SCL decoding process, the CRC bit is decoded as an information bit, and is an unknown bit. Therefore, in the decoding process, path extension needs to be performed. Because the value of the check frozen bit is determined based on the information bit prior to the check frozen bit and the check equation, like an original frozen bit, the check frozen bit is decoded as a known bit. Therefore, in the decoding process, no path extension is performed, but a decoding result of the value of the check frozen bit is determined based on the decoded information bit prior to the check frozen bit and the check equation. For a detailed decoding process, refer to FIG. 2, FIG. 3, and corresponding descriptions thereof.

1403. Perform CRC check on the L candidate paths.

A CRC check unit 1303 sequentially performs CRC check on the L candidate paths starting from a candidate path with the most optimal metric. The CRC check unit 1303 may perform CRC check on each of the L candidate paths to obtain a check success or check failure result, or may no longer check the remaining candidate paths after obtaining the first candidate path on which the CRC check succeeds.

1404. Use, as a decoding output, an information block on the first candidate path on which the CRC check succeeds.

An output unit 1304 selects, as a decoding result, the first candidate path on which the CRC check succeeds, and uses the information block corresponding to information bits on the path as an output of current decoding.

Figure 15:
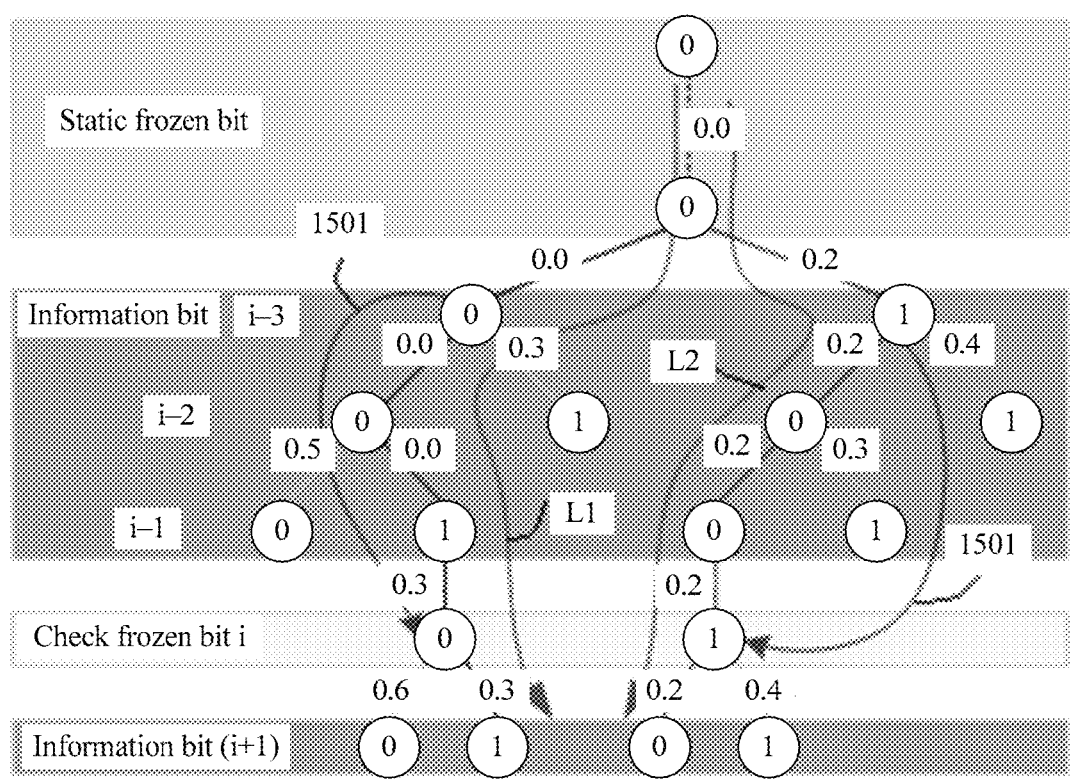
FIG. 15 is a schematic diagram of path extension and path metric update during SCL decoding according to an embodiment of this application.

FIG. 15 shows an example of an SCL decoding algorithm in a case of list=2, and two candidate paths are retained in a decoding process. The first several bits are usually frozen bits, and are set to a fixed value such as 0. Therefore, decoding actually starts from the first information bit. In FIG. 15, a PM value is calculated by using formula (1). In each time of extension, a path with a minimum PM value is retained, and two candidate paths L1 and L2 shown by arrows are finally obtained. A final PM value of the path L1 is 0.3, and a final PM value of the other path L2 is 0.2. CRC check is first performed on the path L2 with a minimum PM (the most optimal metric). If the check succeeds, L2 is selected as a decoding output. If the check on the path L2 fails, the check continues to be performed on the path L1. If the check succeeds, L1 is selected as a decoding output. If the check on both L1 and L2 fails, the path L2 with a smaller PM (the most optimal metric) may be selected as a decoding result for output. If the check on both L1 and L2 fails, it may alternatively be determined that current decoding fails.

In FIG. 15, an $i^{th}$ bit marked in the figure is a check frozen bit, and two arrows 1501 indicate that a value of the check frozen bit is determined based on an $(i-3)^{th}$ bit (an information bit). It can be learned that when the $i^{th}$ bit is decoded, path extension does not need to be performed, and the value of the $i^{th}$ bit is determined based on a value of the $(i-3)^{th}$ bit on the path. Therefore, a value of a check frozen bit on the path L1 is 0, and a value of a check frozen bit on L2 is 1. A difference between FIG. 15 and FIG. 3 lies in that the $i^{th}$ bit is corresponding to a frozen bit in FIG. 3, but is corresponding to a check frozen bit in FIG. 15. In FIG. 15, when the check frozen bit is decoded, a PM value is changed compared with that in FIG. 3. Specifically, in FIG. 15, it is assumed that an LLR(i) of the check frozen bit on the path L1 and an LLR(i) of the check frozen bit on the path L2 are less than 0, and when the LLR(i) is less than 0, a corresponding value is 1. In this case, a decoding result 0 of the $i^{th}$ bit on the path L1 is inconsistent with the result of the LLR(i). Therefore, based on formula (1), the PM value is increased by |LLR(i)|, and is assumed to be 0.3. On the path L2, a decoding result 1 of the $i^{th}$ bit is consistent with the value corresponding to the LLR(i). Therefore, based on formula (1), PM(i)=PM(i-1)=0.2. Because the check frozen bit is introduced, if a bit prior to the frozen bit on L1 is incorrectly decoded, the result of the $i^{th}$ frozen bit that is determined with reference to an $(i-1)^{th}$ information bit prior to the frozen bit is incorrect. Therefore, there is a higher probability that the decoding result of the $i^{th}$ bit is inconsistent with the value corresponding to the LLR(i), and the PM(i) is increased by the penalty |LLR(i)|, so that a PM value of the path is larger and a probability that the incorrect path is deleted in a decoding process is higher. A reason is that a smaller PM value is better in the example.

Figure 16:
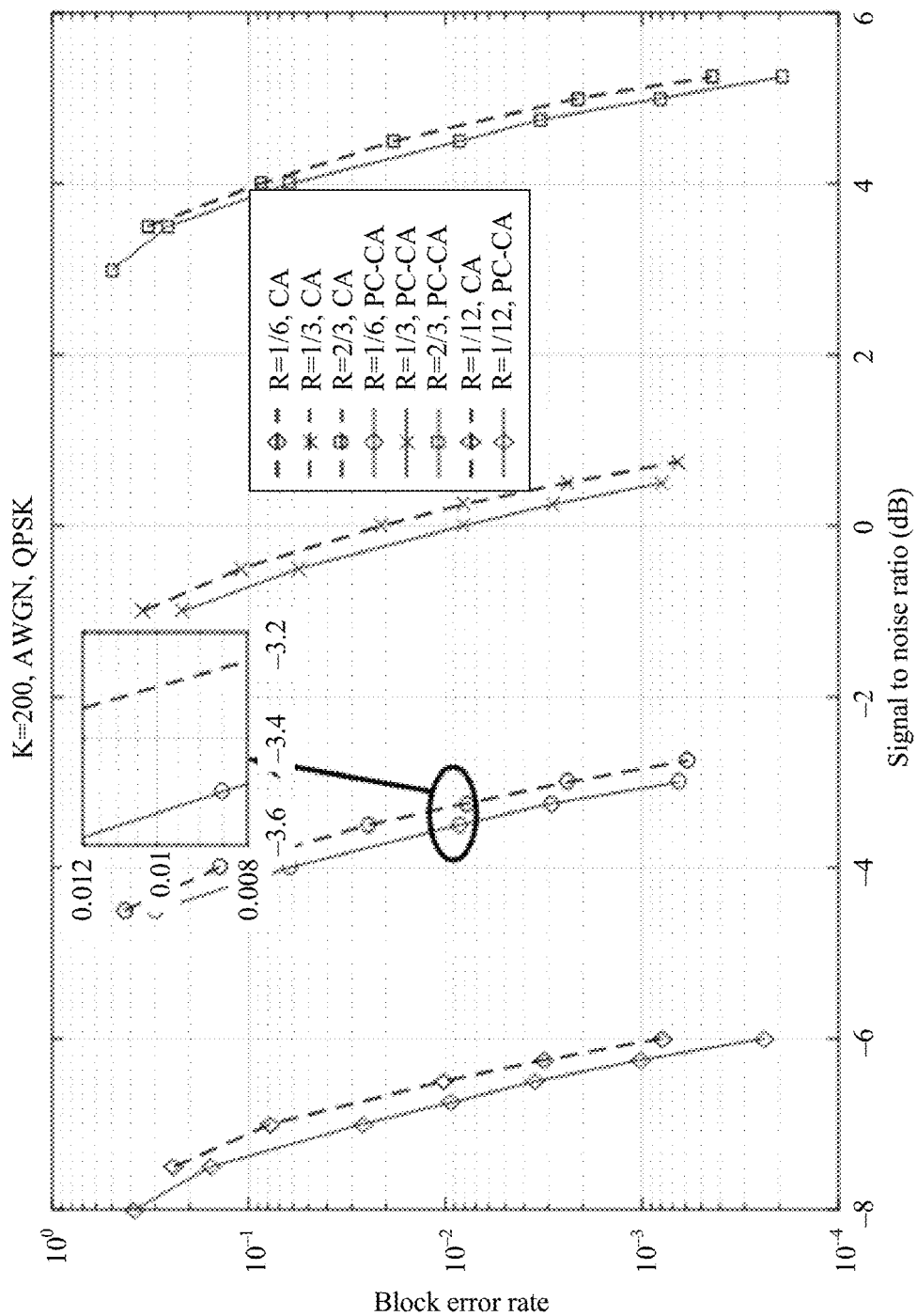
FIG. 16 shows performance simulation results of an encoding/decoding method and conventional CA-polar according to an embodiment of this application.

FIG. 16 shows a performance comparison between a solution of this application and conventional CA-polar on an AWGN channel. In the conventional CA-polar, polar channels other than information bits are all frozen bits, and are all set to 0. In FIG. 16, in the solution of this application, all frozen bits are used as check frozen bits, and information bits whose sequence numbers are the same as values obtained after sequence numbers of the check frozen bits mod 5 are selected to participate in determining values of the check frozen bits. It can be learned from FIG. 16 that there is a performance gain between 0.2 dB to 0.3 dB in the technical solution in this application compared with the conventional CA-polar. A lower bit rate indicates a larger gain. A reason is that in a case of a lower bit rate, more polar channels may be used as check frozen bits, and there is a higher probability that a correct path is retained in an SCL decoding process.

Figure 17:
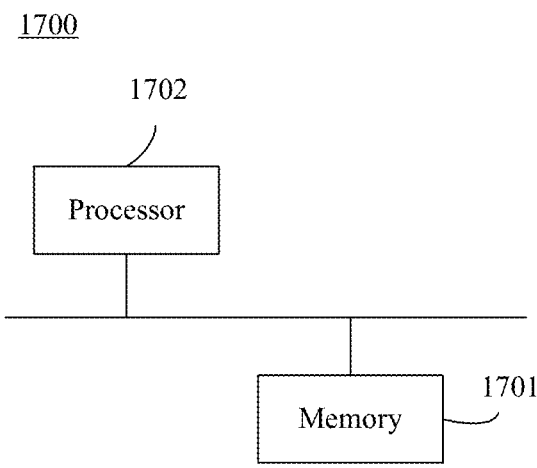
FIG. 17 is a schematic structural diagram of another decoding apparatus according to an embodiment of this application.

A decoding apparatus 1700 shown in FIG. 17 may also be configured to perform the decoding method. The decoding apparatus 1700 includes:

a memory 1701, configured to store a program; and a processor 1702, configured to: execute the program stored in the memory, and when executing the program, perform the decoding method shown in FIG. 14. The method includes: obtaining locations of information bits and frozen bits in to-be-decoded bits, and determining at least one of the frozen bits as a check frozen bit; sequentially decoding the to-be-decoded bits by using a successive cancellation list SCL decoding algorithm, to output L candidate paths with optimal metrics, where a decoding result on each candidate path includes an information block and cyclic redundancy check CRC bits, a value of the check frozen bit on each path is determined based on values of P decoded information bits that are in information bits prior to the check frozen bit and that meet a preset condition, and P is an integer greater than or equal to 1; and performing CRC check on the L candidate paths starting from a candidate path with the most optimal metric, and using, as a decoding output, an information block on the first candidate path on which the CRC check succeeds.

If the CRC check on all of the L candidate paths fails, a path with an optimal metric may be selected as the decoding output, or it may be determined that the decoding fails.

For content such as a manner of determining the check frozen bit and how to select the P information bits, refer to the embodiments of the encoding method and the decoding method. The memory 1701 may be a physically independent unit, or may be integrated into the processor 1702.

The decoding apparatus in FIG. 17 may further include a receiver (not shown in the figure), configured to receive an encoded block, namely, to-be-decoded bits or a sequence of to-be-decoded bits for the decoding apparatus, sent by an encoding apparatus.

Figure 18:
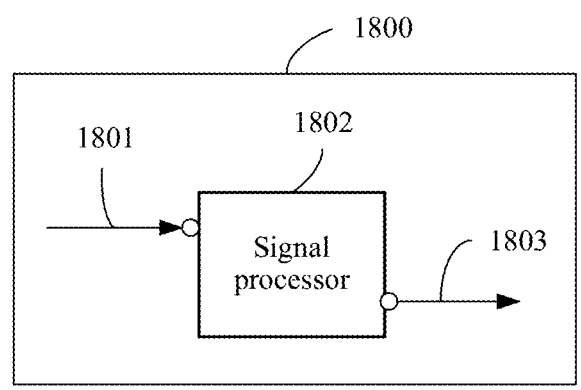
FIG. 18 is a schematic structural diagram of another decoding apparatus according to an embodiment of this application.

As shown in FIG. 18, this application provides another decoding apparatus 1800 that may implement the decoding method in this application. The decoding apparatus 1800 includes:

at least one input (input) end 1801, configured to receive information about to-be-decoded bits;

a signal processor 1802, configured to: obtain locations of information bits and frozen bits in the to-be-decoded bits, and determine at least one of the frozen bits as a check frozen bit; sequentially decode the to-be-decoded bits by using a successive cancellation list SCL decoding algorithm, to output L candidate paths with optimal metrics, where a decoding result on each candidate path includes an information block and cyclic redundancy check CRC bits, a value of the check frozen bit on each path is determined based on values of P decoded information bits that are in information bits prior to the check frozen bit and that meet a preset condition, and P is an integer greater than or equal to 1; and perform CRC check on the L candidate paths starting from a candidate path with the most optimal metric; and at least one output (output) end 1803, configured to use, as a decoding output, an information block on the first candidate path on which the CRC check succeeds.

For content such as a manner of determining the check frozen bit and how to select the P information bits, refer to the embodiments of the encoding method and the decoding method.

Optionally, the signal processor 1802 may be implemented by hardware, for example, a baseband processor, a processing circuit, a decoder, or a decoding circuit.

The decoding apparatus in FIG. 18 may further include a receiver (not shown in the figure), configured to receive an encoded block, namely, to-be-decoded bits or a sequence of to-be-decoded bits for the decoding apparatus, sent by an encoding apparatus.

The decoding apparatus in the embodiments of this application may be any device with a wireless communication function, for example, an access point, a station, user equipment, or a base station.

The successive cancellation list SCL decoding algorithm in the embodiments of this application includes another decoding algorithm that is similar to the SCL decoding algorithm and that is used to sequentially perform decoding and provide a plurality of candidate paths, or an improved algorithm of the SCL decoding algorithm.

In actual use, the encoding apparatus or the decoding apparatus in the embodiments of this application may be an independent device, or may be an integrated device that is configured to: encode to-be-sent information and then send encoded information, or decode received information.

In the examples described in the embodiments of this application, units and method processes may be implemented by electronic hardware or a combination of computer software and electronic hardware. Whether the functions are performed by hardware or software depends on particular applications and design constraints of the technical solutions. A person skilled in the art may use different methods to implement the described functions for each particular application.

In the several embodiments provided in this application, it should be understood that the disclosed apparatus and method may be implemented in other manners. The described apparatus embodiment is merely an example. For example, the unit division is merely logical function division and may be other division in actual implementation. For example, a plurality of units or components may be combined or integrated into another system. Some steps in the method may be ignored or not performed. In addition, couplings or direct couplings or communication connections between the units may be implemented by using some interfaces, and these interfaces may be implemented in electronic, mechanical, or other forms.

The units described as separate parts may or may not be physically separate, and may be located in one location or may be distributed on a plurality of network units. In addition, function units in the embodiments of this application may be integrated into one processing unit, or each of the units may exist alone physically, or two or more units may be integrated into one unit.

The foregoing embodiments may be all or partially implemented by using software, hardware, firmware, or any combination thereof. When software is used to implement the embodiments, the embodiments may be all or partially implemented in a form of a computer program product. The computer program product includes one or more computer instructions. When the computer program instructions are loaded and executed on a computer, the procedure or functions according to the embodiments of the present invention are all or partially generated. The computer may be a general-purpose computer, a dedicated computer, a computer network, or another programmable apparatus. The computer instructions may be stored in a computer readable storage medium, or may be transmitted by using the computer readable storage medium. The computer instructions may be transmitted from a website, a computer, a server, or a data center to another website, computer, server, or data center in a wired (for example, a coaxial cable, an optical fiber, or a digital subscriber line (DSL)) or wireless (for example, infrared, radio, or microwave) manner. The computer readable storage medium may be any usable medium accessible by a computer, or a data storage device, such as a server or a data center, into which one or more usable media are integrated. The usable medium may be a magnetic medium (for example, a floppy disk, a hard disk, a magnetic tape, a USB flash drive, a ROM, or a RAM), an optical medium (for example, a CD or a DVD), a semiconductor medium (for example, a solid state disk(Solid State Disk, SSD)), or the like.

The invention claimed is:

1. A polar encoding method, comprising:
 obtaining locations of information bits and frozen bits based on a reliability order of polar channels, wherein reliability of a polar channel corresponding to the information bits is higher than reliability of a polar channel corresponding to the frozen bits;

performing cyclic redundancy check (CRC) encoding on an information block, and mapping bits obtained after the CRC encoding to the information bits;

selecting at least one bit of the frozen bits as at least one check frozen bit, wherein a value of one of the at least one check frozen bit is determined based on values of P information bits that are in information bits prior to the one of the at least one check frozen bit based on an encoding order of the polar channels and that meet a preset condition, and wherein P is an integer greater than or equal to 1; and performing polar encoding on the information bits, the at least one check frozen bit, and frozen bits other than the at least one check frozen bit.

2. The method according to claim 1, wherein values obtained after sequence numbers of the P information bits mod Q are the same as a value obtained after a sequence number of the one of the at least one check frozen bit mod Q, and wherein Q is an integer greater than or equal to 1.

3. The method according to claim 2, wherein Q is a prime number or an odd number.

4. The method according to claim 1, wherein the P information bits that meet the preset condition are information bits that are randomly determined in all information bits prior to the one of the at least one check frozen bit based on the encoding order of the polar channels.

5. The method according to claim 4, wherein for each check frozen bit, a random number is generated for each information bit prior to the one of the at least one check frozen bit by using a random seed, and wherein if the random number is less than a preset threshold T, the information bit participates in determining the value of the one of the at least one check frozen bit.

6. The method according to claim 5, wherein random numbers evenly distributed between 0 and 1 are generated by using the random seed, and wherein T is a value greater than 0 and less than 1.

7. The method according to claim 1, wherein:
the P information bits comprise an information bit whose sequence number is the same as a value obtained after a sequence number of the one of the at least one check frozen bit mod Q1, Q2, . . . , or Qh, h is an integer greater than or equal to 2, and Q1, Q2, . . . , and Qh are respectively integers greater than or equal to 1 and different from each other; or
a difference between a sequence number of each information bit of the P information bits and a sequence number of the one of the at least one check frozen bit is not equal to an integer power of 2.

8. The method according to claim 1, wherein a quantity of 1s in a vector obtained by adding a row vector corresponding to any one of the P information bits in an encoding matrix and a row vector corresponding to the one of the at least one check frozen bit in the encoding matrix is greater than a quantity of 1s in the row vector corresponding to the any one information bit in the encoding matrix.

9. The method according to claim 1, wherein after the bits obtained after the CRC encoding are mapped to the information bits, a location relationship between the CRC bits and the information block comprises one of:
the CRC bits are located after the information block;
the CRC bits are located before the information block;
the CRC bits are inserted into the information block; or
the CRC bits are divided into a plurality of segments, and each segment is inserted into the information block, is located before the information block, or is located after the information block.

10. An encoding apparatus, comprising:
at least one input end, the at least one input end configured to receive an information block;
at least one signal processor, the at least one signal processor configured to perform the method according to claim 1; and
at least one output end, the at least one output end configured to output an encoded block obtained by the at least one signal processor.

11. A non-transitory computer readable storage medium, wherein the non-transitory computer readable storage medium stores an instruction, and wherein when the instruction runs on a computer, the computer is enabled to perform the method according to claim 1.

12. A computer program product, comprising a non-transitory computer readable medium, wherein when the computer program product runs on a computer, the computer is enabled to perform the method according to claim 1.

13. An encoding apparatus, comprising:
memory; and
at least one processor, the at least one processor coupled to the memory and configured to:
obtain locations of information bits and frozen bits based on a reliability order of polar channels, wherein reliability of a polar channel corresponding to the information bits is higher than reliability of a polar channel corresponding to the frozen bits;
perform cyclic redundancy check (CRC) encoding on an information block, and map bits obtained after the CRC encoding to the information bits;
select at least one bit of the frozen bits as at least one check frozen bit, wherein a value of one of the at least one check frozen bit is determined based on values of P information bits that are in information bits prior to the one of the at least one check frozen bit based on an encoding order of the polar channels and that meet a preset condition, and wherein P is an integer greater than or equal to 1; and
perform polar encoding on the information bits, the at least one check frozen bit, and frozen bits other than the at least one check frozen bit.

14. The apparatus according to claim 13, wherein values obtained after sequence numbers of the P information bits mod Q are the same as a value obtained after a sequence number of the one of the at least one check frozen bit mod Q, and wherein Q is an integer greater than or equal to 1.

15. The apparatus according to claim 13, wherein the P information bits that meet the preset condition are information bits that are randomly determined in all information bits prior to the one of the at least one check frozen bit based on the encoding order of the polar channels.

16. The apparatus according to claim 15, wherein for each check frozen bit, a random number is generated for each information bit prior to the one of the at least one check frozen bit by using a random seed, and wherein if the random number is less than a preset threshold T, the information bit participates in determining the value of the one of the at least one check frozen bit.

17. The apparatus according to claim 16, wherein random numbers evenly distributed between 0 and 1 are generated by using the random seed, and wherein T is a value greater than 0 and less than 1.

18. The apparatus according to claim 13, wherein:
the P information bits comprise an information bit whose sequence number is the same as a value obtained after a sequence number of the one of the at least one check frozen bit mod Q1, Q2, . . . , or Qh, h is an integer greater than or equal to 2, and Q1, Q2, . . . , and Qh are respectively integers greater than or equal to 1 and different from each other; or
a difference between a sequence number of each information bit of the P information bits and a sequence number of the one of the at least one check frozen bit is not equal to an integer power of 2.

19. The apparatus according to claim 13, wherein a quantity of 1s in a vector obtained by adding a row vector corresponding to any one of the P information bits in an encoding matrix and a row vector corresponding to the one of the at least one check frozen bit in the encoding matrix is greater than a quantity of 1s in the row vector corresponding to the any one information bit in the encoding matrix.

20. The apparatus according to claim 13, wherein after the bits obtained after the CRC encoding are mapped to the information bits, a location relationship between the CRC bits and the information block comprises one of:
the CRC bits are located after the information block;
the CRC bits are located before the information block;
the CRC bits are inserted into the information block; or
the CRC bits are divided into a plurality of segments, and each segment is inserted into the information block, is located before the information block, or is located after the information block.

* * * * *